United States Patent
Wachi et al.

(10) Patent No.: US 6,962,893 B2
(45) Date of Patent: Nov. 8, 2005

(54) IMAGE-FORMING MATERIAL, IMAGE FORMATION METHOD AND METHOD FOR MANUFACTURING COLOR PROOF

(75) Inventors: Naotaka Wachi, Shizuoka (JP); Akira Hatakeyama, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 149 days.

(21) Appl. No.: 10/230,057

(22) Filed: Aug. 29, 2002

(65) Prior Publication Data

US 2003/0143379 A1 Jul. 31, 2003

(30) Foreign Application Priority Data

Aug. 31, 2001 (JP) .................................... P.2001-263920

(51) Int. Cl.⁷ ........................ B41M 5/035; B41M 5/38
(52) U.S. Cl. ................ 503/227; 428/32.39; 428/32.51; 428/32.52; 428/32.81
(58) Field of Search .......................... 428/32.39, 32.51, 428/32.52, 32.81; 503/227

(56) References Cited

U.S. PATENT DOCUMENTS

| | | | |
|---|---|---|---|
| 5,578,824 A | | 11/1996 | Koguchi et al. |
| 5,762,743 A | * | 6/1998 | Nakamura .................. 156/235 |
| 5,973,140 A | * | 10/1999 | Kumagae et al. ........... 540/125 |
| 6,235,445 B1 | | 5/2001 | Nakamura et al. |
| 6,326,121 B1 | * | 12/2001 | Takahashi ................... 430/200 |
| 6,482,768 B1 | | 11/2002 | Yoshinari et al. |

FOREIGN PATENT DOCUMENTS

| | | |
|---|---|---|
| EP | 0 739 751 A2 | 10/1996 |
| EP | 0 751 008 A1 | 1/1997 |
| EP | 1 120 282 A1 | 8/2001 |
| JP | 5-58045 | 3/1993 |
| JP | 6-219052 | 8/1994 |
| JP | 8-238858 | 9/1996 |

OTHER PUBLICATIONS

European Search Report dated Feb. 9, 2004.

* cited by examiner

Primary Examiner—B. Hamilton Hess
(74) Attorney, Agent, or Firm—Sughrue Mion, PLLC

(57) ABSTRACT

To provide an image-forming material, an image formation method and a method for manufacturing a color proof, where even when laser recording is performed with a higher energy by multi-beam laser light, a light-to-heat conversion substance or a decomposition product thereof is prevented from transferring to the image-forming layer and at the same time, a transfer image having sufficiently high image density, high resolution, and no layer fogging can be formed on an image-receiving sheet.

An image-forming material comprising an image-receiving sheet having at least an image-receiving layer and a thermal transfer sheet comprising a support having thereon at least a light-to-heat conversion layer and an image-forming layer, wherein the light-to-heat conversion layer of the thermal transfer sheet comprises a homopolymer and/or a copolymer of vinylpyrrolidone.

9 Claims, 2 Drawing Sheets

IMAGE-FORMING MATERIAL, IMAGE FORMATION METHOD AND METHOD FOR MANUFACTURING COLOR PROOF

FIELD OF THE INVENTION

The present invention relates to an image-forming material comprising an image-receiving sheet and a thermal transfer sheet, an image formation method of forming a high-resolution full color image using laser light, and a production method of a color proof. In particular, the present invention relates to an image-forming material and an image formation method, which are useful for manufacturing a color proof (DDCP, direct digital color proof) in the printing field or a mask image by laser recording from digital image signals.

BACKGROUND OF THE INVENTION

In the field of graphic art, an image is printed on a printing plate using a set of color-separation films prepared from a color original by using lithographic films. In general, a color proof is manufactured from the color-separation films before the main printing (i.e., actual printing operation) so as to check on errors in the color separation process or whether color correction and the like are necessary. The color proof is demanded to realize high resolution for enabling the formation of a halftone image with high reproducibility and to have capabilities such as high processing stability. Furthermore, in order to obtain a color proof approximated to an actual printed matter, the materials used for the color proof are preferably the materials actually used for the printed matter, for example, the substrate is preferably the printing paper and the coloring material is preferably the pigment. As for the method for manufacturing the color proof, a dry process of using no developer solution is highly demanded.

For manufacturing the color proof by a dry process, a recording system of manufacturing a color proof directly from digital signals has been developed accompanying the recently widespread electronic system in the pre-printing process (pre-press field). This electronic system is developed particularly for the purpose of manufacturing a high-quality color proof and by this system, a halftone image of 150 lines/inch or more is generally reproduced. For recording a high-quality proof from digital signals, laser light capable of modulating by the digital signals and sharply focusing the recording light is used as the recording head. Accordingly, the image-forming material used therefor is required to exhibit high recording sensitivity to the laser light and high resolution for enabling the reproduction of high-definition halftone dots.

With respect to the image-forming material for use in the transfer image formation method using laser light, a heat-fusion transfer sheet is known, where a light-to-heat conversion layer capable of generating heat upon absorption of the laser light and an image-forming layer containing a pigment dispersed in a heat-fusible component such as wax or binder are provided on a support in this order (see, JP-A-5-58045 (the term "JP-A" as used herein means an "unexamined published Japanese patent application")). According to the image formation method using this image-forming material, heat is generated in the region irradiated with the laser light of the light-to-heat conversion layer and the image-forming layer corresponding to the region is fused by the heat and transferred to an image-receiving sheet stacked and disposed on the transfer sheet, whereby a transfer image is formed on the image-receiving sheet.

JP-A-6-219052 discloses a thermal transfer sheet where a light-to-heat conversion layer containing a light-to-heat conversion substance, a very thin (0.03 to 0.3 $\mu$m) thermal peeling layer and an image-forming layer containing a coloring material are provided on a support in this order. In this thermal transfer sheet, the bonding strength between the image-forming layer and the light-to-heat conversion layer bonded with an intervention of the thermal peeling layer is diminished upon irradiation with laser light and a high-definition image is formed on an image-receiving sheet stacked and disposed on the thermal transfer sheet. This image formation method using the above-described thermal transfer sheet utilizes so-called "ablation", more specifically, a phenomenon such that a part of the thermal peeling layer in the region irradiated with the laser light is decomposed and vaporized and thereby the bonding strength between the image-forming layer and the light-to-heat conversion layer is diminished in that region, as a result, the image-forming layer in this region is transferred to an image-receiving sheet stacked on the thermal transfer sheet.

These image formation methods are advantageous in that a printing paper having provided thereon an image-receiving layer (adhesive layer) can be used as the image-receiving sheet material and a multicolor image can be easily obtained by sequentially transferring images of different colors to the image-receiving sheet. In particular, the image formation method using ablation is advantageous in that a high-definition image can be easily obtained, and therefore, this method is useful for the manufacture of DDCP or a high-definition mask image.

In recording an image with laser light, a laser light comprising multiple beams using a plurality of laser beams is recently used so as to shorten the recording time. However, if a conventional thermal transfer sheet is used for the recording with multi-beam laser light, problems are liable to arise, for example, the light-to-heat conversion layer is transferred to the transfer image formed on the image-receiving sheet to cause layer fogging, the transfer sensitivity decreases to fail in attaining sufficiently high image density, or the resolution is low.

Furthermore, the light-to-heat conversion substance such as infrared ray absorbing dye or a decomposition product thereof contained in the light-to-heat conversion layer transfers to the image-forming layer and the obtained transfer image disadvantageously has yellowish color hue.

SUMMARY OF THE INVENTION

The present invention has been made to solve these problems in conventional techniques and the object of the present invention is to provide an image-forming material, an image formation method and a method for manufacturing a color proof, where even when laser recording is performed with a higher energy by multi-beam laser light, a light-to-heat conversion substance or a decomposition product thereof is prevented from transferring to the image-forming layer and at the same time, a transfer image having sufficiently high image density, high resolution, reduced in-plane density unevenness and no layer fogging can be formed on an image-receiving sheet.

The above-described object can be attained by the following means.

(1) An image-forming material comprising an image-receiving sheet having at least an image-receiving layer and a thermal transfer sheet comprising a support having thereon at least a light-to-heat conversion layer and an image-forming layer, wherein the light-to-heat conversion layer of the thermal transfer sheet comprises a homopolymer and/or a copolymer of vinylpyrrolidone.

(2) The image-forming material as described in (1) above, wherein the main binder of the light-to-heat conversion layer is a polyimide resin or a polyamide resin.

(3) The image-forming material as described in (1) or (2) above, wherein the vinylpyrrolidone copolymer contains a vinylpyrrolidone moiety in a molar ratio of 50% to less than 100%.

(4) The image-forming material as described in any one of (1) to (3) above, wherein the copolymer component of the vinylpyrrolidone copolymer is incompatible with the main binder of the light-to-heat conversion layer.

(5) The image-forming material as described in any one of (1) to (4) above, wherein the copolymer component of the vinylpyrrolidone copolymer is selected from the group consisting of vinyl acetate, styrene, olefin, acrylic acid, methacrylic acid, and derivatives thereof.

(6) The image-forming material as described in any one of (1) to (5) above, wherein the thermal transfer sheet comprises four or more thermal transfer sheets each having an image-forming layer containing at least a yellow, magenta, cyan or black pigment.

(7) An image formation method comprising a step of superposing the image-forming layer described in (6) above and the image-receiving layer described in (1) above to face each other and irradiating a laser light from the support side of the thermal transfer sheet to transfer the laser light-irradiated region of the image-forming layer onto the image-receiving layer of the image-receiving sheet, thereby recording an image, the step being performed for each thermal transfer sheet.

(8) A method for manufacturing a color proof, comprising re-transferring a full color image formed on the image-receiving layer of an image-receiving sheet by the image formation method described in (7) above, together with the image-receiving layer onto a printing paper.

Figure 1:
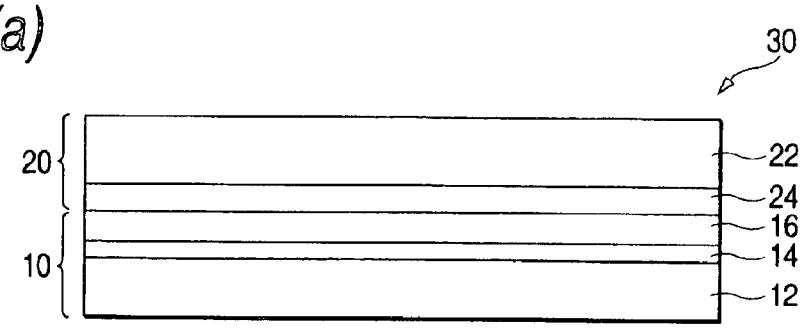
FIG. 1 is a view schematically showing the mechanism of image formation by thin-film thermal transfer using a laser.
Figure 1:
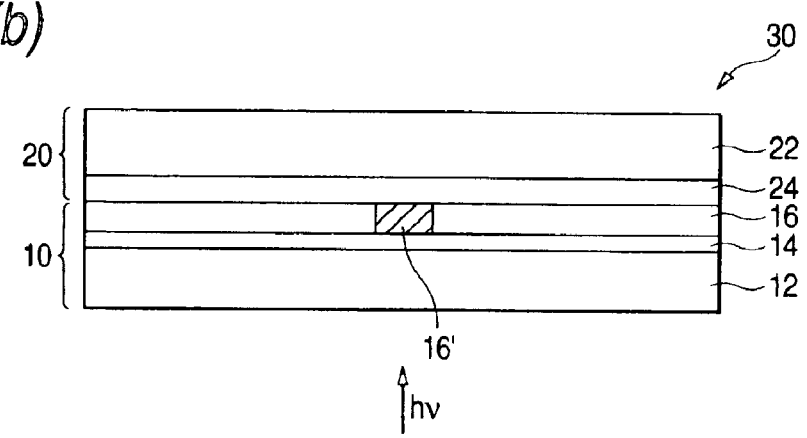
Figure 1:
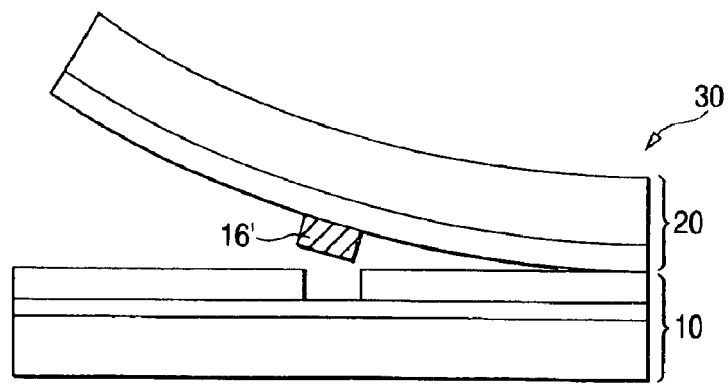

1 Recording device
2 Recording head
3 Sub-scan rail
4 Recording drum
5 Thermal transfer sheet loading unit
6 Image-receiving sheet roll
7 Transportation roller
8 Squeeze roller
9 Cutter
10 Thermal transfer sheet
10K, 10C, 10M, 10Y Thermal transfer sheet rolls
12 Support
14 Light-to-heat conversion layer
16 Image-forming layer
20 Image-receiving sheet
22 Support for image-receiving sheet
24 Image-receiving layer
30 Laminate
31 Discharge table
32 Discard port
33 Discharge port
34 Air
35 Discard box

DETAILED DESCRIPTION OF THE INVENTION image-forming material of the present invention comprises an image-receiving sheet and a thermal transfer sheet, wherein a homopolymer and/or a copolymer of vinylpyrrolidone is contained in the light-to-heat conversion layer. Hereinafter, a homopolymer of vinylpyrrolidone is referred to as a vinylpyrrolidone polymer and a copolymer of vinylpyrrolidone is referred to as a vinylpyrrolidone copolymer. The hydrogen atom in the ring part of the vinylpyrrolidone polymer and/or vinylpyrrolidone copolymer may be substituted by an alkyl group, a halogen atom or the like, if desired.

In the present invention, a vinyl pyrrolidone polymer and/or a vinylpyrrolidone copolymer may be used alone as the binder of the light-to-heat conversion layer but is preferably used in combination with other resin. In the case where the resin used in combination is the main binder of the light-to-heat conversion layer, the resin used in combination is referred to as a main binder.

When the main binder of the light-to-heat conversion layer is a polyimide resin or a polyamide resin, the main binder is compatibilized with the vinylpyrrolidone component of the vinylpyrrolidone polymer or vinylpyrrolidone copolymer and the phase separation is prevented from occurring, as a result, the image density unevenness ascribable to unevenness in the heat conduction from the light-to-heat conversion layer to the image-forming layer can be prevented. At this time, in the case of a vinyl pyrrolidone copolymer, when a component incompatible with the polyimide resin or polyamide resin is selected as the copolymer component of the vinylpyrrolidone copolymer, this incompatible component traps a light-to-heat conversion substance or a decomposition product thereof, as a result, the light-to-heat conversion substance or a decomposition product thereof can be more effectively prevented from transferring to the image-receiving layer at the transfer of the image-forming layer and in turn, the transfer image can have good color hue.

The copolymer component having such a function of the vinylpyrrolidone copolymer is not particularly limited insofar as it is incompatible with polyimide resin or polyamide resin, however, preferred examples thereof include vinyl acetate, styrene, olefin, acrylic acid and methacrylic acid. One or more of these components can be used as the copolymer component of the vinylpyrrolidone copolymer. The ratio of the copolymer component is, in terms of molar ratio, preferably vinylpyrrolidone:copolymer component= 50 to less than 100:more than 0 to 50, more preferably 60 to 90:10 to 40.

The mass average molecular weight of the vinylpyrrolidone polymer or vinylpyrrolidone copolymer is preferably from 2,000 to 500,000, more preferably from 10,000 to 250,000.

Preferred examples of the vinylpyrrolidone copolymer include vinylpyrrolidone/vinyl acetate copolymer, vinylpyrrolidone/styrene copolymer, vinylpyrrolidone/1-butene copolymer and vinylpyrrolidone/acrylic acid copolymer.

In the present invention, a vinylpyrrolidone polymer and/or vinylpyrrolidone copolymer is incorporated into the light-to-heat conversion layer. The incorporating form is not particularly limited and an arbitrary form may be used. In the light-to-heat conversion layer, the blending ratio of the main binder and the vinylpyrrolidone polymer and/or vinylpyrrolidone copolymer is preferably such that the vinylpyrrolidone polymer and/or vinylpyrrolidone copolymer is from 0.1 to 30 mass % (i.e., weight %), more preferably from 1 to 10 mass %, based on the main binder.

The thermal transfer sheet of the image-forming material of the present invention preferably comprises four or more thermal transfer sheets each having an image-forming layer containing at least a yellow, magenta, cyan or black pigment.

The present invention provides an image formation method comprising performing a step of superposing the image-forming layer of the above-described thermal transfer sheet and the image-receiving layer to face each other and irradiating a laser light from the support side of the thermal transfer sheet to transfer the laser light-irradiated region of the image-forming layer onto the image-receiving layer of the image-receiving sheet, thereby recording an image, the step being performed for each thermal transfer sheet.

Also, the present invention provides a method for manufacturing a color proof, comprising re-transferring a full color image formed on the image-receiving layer of an image-receiving sheet by the above-described image formation method, together with the image-receiving layer onto a printing paper.

The processing in the CTP (computer-to-plate) age is a filmless processing and to cope with this, a contract proof is necessary to take the place of proof printing or analogue color proof. For acquiring the approval from clients, color reproduction agreeing with the printed matter or analogue color proof is required and the present inventors have developed a DDCP system where the same pigment-type coloring material as the printing ink is used, the transfer to printing paper can be performed, and moire and the like are not generated. The target thereof is a large-size (A2/B2) digital direct color proof system capable of transferring an image to printing paper, using the same pigment-type coloring material as the printing ink and giving high approximation to a printed matter. The present invention provides an image-forming material preferably suitable for the system where a laser thin film transfer system is employed, a pigment coloring material is used and transfer to printing paper can be attained by real halftone dot recording, and also provides a method for producing the image-forming material and a method for manufacturing a color proof.

The present invention is effective and suitable for a system where a thermal transfer image formed by sharp halftone dots is realized, and transfer to the printing paper and B2 size recording (515 mm or more×728 mm; here, B2 size is 543 mm×765 mm) can be performed.

The thermal transfer image can be formed as a halftone image with a resolution of 2,400 to 2,540 dpi according to the printing screen ruling. Individual dots are almost free of blurring or missing and favored with a very sharp shape and therefore, halftone dots over a wide range from highlight to shadow can be clearly formed. As a result, high-level halftone dots can be output with the same resolution as in the image setter or CTP setter and the reproduced halftone dot and gradation can have good approximation to the printed matter.

Furthermore, this thermal transfer image has a sharp dot shape and therefore, halftone dots responding to a laser beam can be faithfully reproduced. Also, since the dependency of recording characteristics on the ambient temperature and humidity is very small, the color hue and the density both can be stably and repeatedly reproduced in an environment over a wide temperature and humidity range.

This thermal transfer image is formed using a colored pigment for use in printing ink and also has good repeated reproduction property, so that high-precision CMS (color management system) can be realized.

Furthermore, this thermal transfer image can agree almost completely with the color hue such as Japan color and SWOP color, namely, the color hue of printed matter. Also, the change in viewing of colors accompanying the change of light source such as fluorescent lamp or incandescent lamp can be the same as on the printed matter.

This thermal transfer image has a sharp dot shape and therefore, fine lines of a fine letter can be sharply reproduced. The heat generated by a laser light does not diffuse in the plane direction but is transmitted to the transfer interface to sharply break the image-forming layer at the interface between the heated part and the non-heated part. Therefore, in the thermal transfer sheet, the light-to-heat conversion layer can be reduced in the thickness and the image-forming layer can be controlled in the dynamical characteristics.

In a simulation, the light-to-heat conversion layer is presumed to momentarily reach about 700° C. and if the layer is thin, the layer is readily deformed or broken. If the deformation or breakage occurs, there arise troubles, more specifically, the light-to-heat conversion layer is transferred to the image-receiving sheet together with the image-forming layer or a non-uniform transfer image is formed. On the other hand, for obtaining a predetermined temperature, a light-to-heat conversion substance must be present in the film at a high concentration and this causes a problem, for example, the dye may precipitate or migrate to the adjacent layer.

Therefore, the light-to-heat conversion layer is preferably reduced in the thickness to about 0.5 $\mu$m or less by selecting an infrared absorbing dye having excellent light-to-heat conversion property and a heat-resistant binder such as polyimide-base compound.

Furthermore, in general, if the light-to-heat conversion is deformed or the image-forming layer itself is deformed due to heat at a high temperature, the image-forming layer transferred to the image-receiving layer causes unevenness in the thickness correspondingly to the sub-scanning pattern of the laser light, as a result, the image becomes non-uniform and the apparent transfer density decreases. This tendency is more serious as the thickness of the image-forming layer is smaller. On the other hand, if the thickness of the image-forming layer is large, the sharpness of a dot is impaired and at the same time, the sensitivity decreases.

In order to attain these contradictory performances at the same time, a low melting point substance such as wax is preferably added to the image-forming layer to improve the transfer unevenness. Also, a matting agent such as inorganic fine particle may be added in place of the binder to properly increase the layer thickness, whereby the image-forming layer can sharply break at the interface between the heated part and the unheated part and the transfer unevenness can be improved while maintaining the dot sharpness and the sensitivity.

Generally, the low melting point substance such as wax has a tendency to bleed out to the surface of the image-forming layer or undertake crystallization and in some cases, this substance causes a problem in the image quality or the aging stability of the thermal transfer sheet.

For solving this problem, a low melting point substance having a small difference in the Sp value from the polymer of the image-forming layer is preferably used, whereby the compatibility with the polymer can be elevated and the separation of the low melting point substance from the image-forming layer can be prevented. Also, several kinds of low melting point substances different in the structure are preferably mixed to provide an eutectic state and thereby prevent the crystallization. By employing these means, an image having a sharp dot shape and reduced in the unevenness can be obtained.

Also, in general, when the coated layer of the thermal transfer sheet absorbs moisture, the layer is changed in the dynamical properties and thermal properties to cause temperature and humidity dependency of the recording environment.

In order to reduce this temperature and humidity dependency, the dye/binder system of the light-to-heat conversion layer and the binder system of the image-forming layer each is preferably an organic solvent system. In addition, while selecting a polyvinyl butyral as the binder of the image-receiving layer, a polymer hydrophobitization technique is preferably introduced so as to reduce the water absorptivity of the binder. Examples of the polymer hydrophobitization technique include a technique of reacting a hydroxyl group with a hydrophobic group described in JP-A-8-238858 and a technique of crosslinking two or more hydroxyl groups by a hardening agent.

Usually, a heat of about 500° C. or more is applied to the image-forming layer at the time of printing an image by a laser exposure and some pigments conventionally used are thermally decomposed but this can be prevented by employing a highly heat-resistant pigment for the image-forming layer.

Due to heat of high temperature at the printing of an image, the infrared absorbing dye migrates from the light-to-heat conversion layer into the image-forming layer and the color hue is changed. For preventing this, as described above, the light-to-heat conversion layer is preferably designed using a combination of an infrared absorbing dye having high holding power and a binder.

In general, high-speed printing of an image causes shortage of energy and generates gaps particularly corresponding to the intervals of the laser sub-scanning. As described above, the elevation of the dye concentration in the light-to-heat conversion layer and the reduction in the thickness of the light-to-heat conversion layer/image-forming layer can increase the efficiency in generation/transmission of heat. Furthermore, for the purpose of providing an effect of allowing the image-forming layer to slightly fluidize at the heating and thereby fill the gap and also elevating the adhesive property to the image-forming layer, a low melting point substance is preferably added to the image-forming layer. In addition, for elevating the adhesive property between the image-receiving layer and the image-forming layer and ensuring a sufficiently high strength of the image transferred, the same polyvinyl butyral as, for example, in the image-forming layer is preferably employed as the binder of the image-receiving layer.

The image-receiving sheet and the thermal transfer sheet are preferably held on a drum by vacuum contact. This vacuum contact is important because the image is formed by controlling the adhesive strength between those two sheets and the image transfer behavior is very sensitive to the clearance between the image-receiving layer surface of the image-receiving sheet and the image-forming layer surface of the transfer sheet. If a foreign matter such as dust triggers widening of the clearance between materials, image defect or uneven image transfer is caused.

For preventing such image defect or uneven image transfer, uniform asperities are preferably provided on the thermal transfer sheet so as to attain good passing of air and obtain uniform clearance.

For providing asperities on the thermal transfer sheet, after-treatment (such as embossing) or addition of a matting agent to the coated layer is generally employed, however, from the standpoint of simplifying the production process and stabilizing the material in aging, the addition of a matting agent is preferred. The matting agent preferably has a larger size than the thickness of the coated layer. If the matting agent is added to the image-forming layer, the image in the area of allowing the presence of the matting agent is missed. Therefore, a matting agent having an optimal particle size is preferably added to the light-to-heat conversion layer. By adding as such, the image-forming layer itself can have almost a uniform thickness and an image free of defects can be obtained on the image-receiving sheet.

In order to realizing the above-described sharp dot without fail, a high-precision design is demanded also in the recording device side. The fundamental construction is the same as in conventional recording devices for laser thermal transfer. The construction is a so-called heat mode outer drum recording system where a recording head equipped with a plurality of high-power lasers irradiates the lasers on a thermal transfer sheet and an image-receiving sheet, which are fixed on a drum, thereby performing the recording. Among these constructions, the following embodiment is preferred.

The image-receiving sheet and the thermal transfer sheet are fed by full automatic roll feeding. The image-receiving layer and the thermal transfer sheet each is fixed to the recording drum by vacuum adsorption. On the recording drum, a large number of vacuum adsorption holes are formed and the pressure inside the drum is reduced using a blower or a decompression pump, whereby the sheet is adsorbed to the drum. Through the image-receiving sheet in the adsorbed state, the thermal transfer sheet is further adsorbed and therefore, the size of the thermal transfer sheet is rendered larger than the image-receiving sheet. The air between the thermal transfer sheet and the image-receiving sheet, which has a greatest effect on the recording performance, is suctioned in the area only of the thermal transfer sheet outside the image-receiving sheet.

In this device, many large-area sheets of B2 size or more can be accumulated one on another in the discharge table and therefore, a method of blowing an air between two sheets and floating the sheet which is discharged later is employed.

Figure 2:
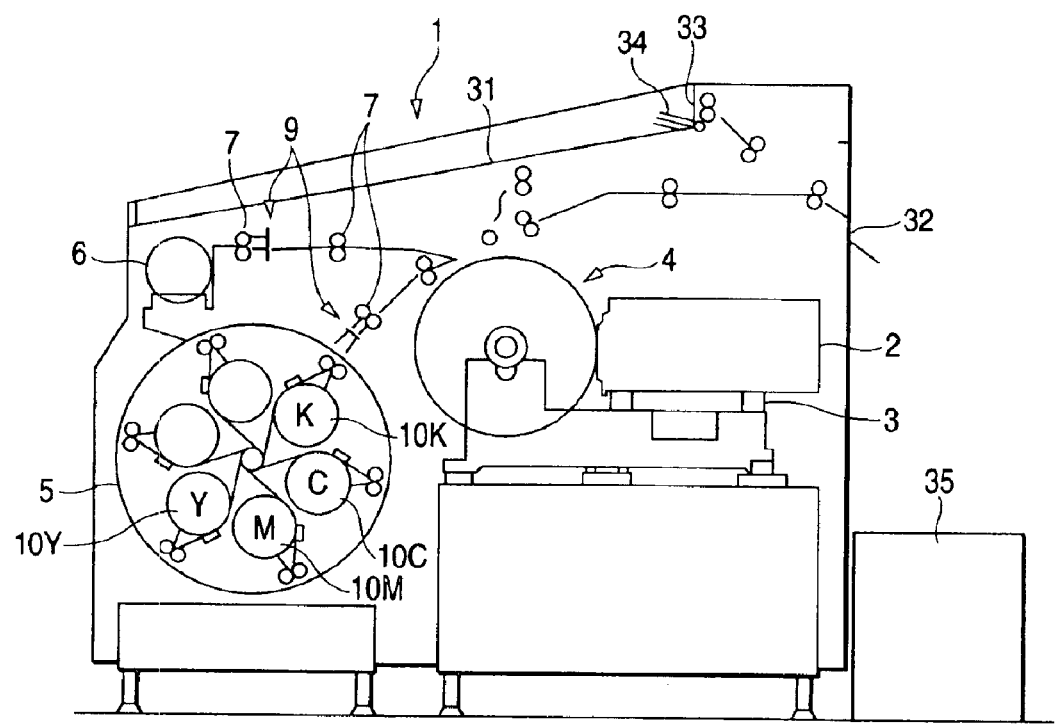
FIG. 2 is a view showing a construction example of a recording device for laser thermal transfer.

FIG. 2 shows a construction example of this device.

The sequence in this device is described below.

1) In a recording device 1, the sub-scan axis of a recording head 2 is returned to the original site by means of a subs-scan rail 3, and also the main scan rotation axis of a recording drum 4 and a thermal transfer sheet loading unit 5 are returned to respective original sites.

2) An image-receiving sheet roll 6 is untied by a transportation roller 7 and the leading end of an image-receiving sheet is vacuum-suctioned through suction holes provided on the recording drum 4, and fixed on the recording drum.

3) A squeeze roller 8 comes down on the recording drum 4 to press the image-receiving sheet and stops pressing when a predetermined amount of the image-receiving sheet is transported by the rotation of the drum, and the image-receiving sheet is cut by a cutter 9 to a predetermined length.

4) The recording drum continues to make one rotation and thereby, the loading of the image-receiving sheet is completed.

5) In the same sequence as that for the image-receiving sheet, a thermal transfer sheet K having a first color (black) is drawn out from a thermal transfer sheet roll 10K and cut to complete the loading.

6) Then, the recording drum 4 starts rotating at a high speed, the recording head 2 on the sub-scan rail 3 starts moving and when reached a recording initiation position, a recording laser is irradiated on the recording drum 4 by the recording head 2 according to the recording image signals. The irradiation is finished at the recording completion position and the moving of sub-scan rail and the rotation of drum are stopped. The recording head on the sub-scan rail is returned to the original site.

7) While allowing the image-receiving sheet to remain on the recording drum, only the thermal transfer sheet K is peeled off. The leading end of the thermal transfer sheet K is hooked by a nail, pulled out in the discharge direction and discarded to the discard box 35 through the discard port 32.

8) 5) to 7) are repeated for transferring remaining three color portions. The recording order subsequent to black is cyan, magenta and yellow in this order. More specifically, a thermal transfer sheet C having a second color (cyan), a thermal transfer sheet M having a third color (magenta) and a thermal transfer sheet Y having a fourth color (yellow) are sequentially drawn out from a thermal transfer sheet roll 10C, a thermal transfer sheet roll 10M and a thermal transfer sheet roll 10Y, respectively. The transfer order is generally reversed to the printing order and this is because at the transfer on the printing paper in the later step, the color order on the printing paper is reversed.

9) After the completion of transfer of four colors, the recorded image-receiving sheet is finally discharged to a discharge table 31. The image-receiving sheet is peeled off from the drum in the same manner as that for the thermal transfer sheet in 7), however, unlike the thermal transfer sheet, the image-receiving sheet is not discarded and therefore, when transported until the discard port 32, is returned to the discharge table by means of switch back. On discharging the image-receiving sheet into the discharge table, an air 34 is blown from the lower part of a discharge port 33, so that a plurality of sheets can be accumulated.

An adhesive roller having provided on the surface thereof an adhesive material is preferably used for any one transportation roller 7 disposed at the positions of feeding or transporting the thermal transfer sheet roll or the image-receiving sheet roll.

By providing an adhesive roller, the surfaces of the thermal transfer sheet and the image-receiving sheet can be cleaned.

Examples of the adhesive material provided on the surface of the adhesive roller include an ethylene-vinyl acetate copolymer, an ethylene-ethyl acrylate copolymer, a polyolefin resin, a polybutadiene resin, a styrene-butadiene copolymer (SBR), a styrene-ethylene-butene-styrene copolymer (SEBS), an acrylonitrile-butadiene copolymer (NBR), a polyisoprene resin (IR), a styrene-isoprene copolymer (SIS), an acrylic acid ester copolymer, a polyester resin, a polyurethane resin, an acrylic resin, a butyl rubber and polynorbornene.

The adhesive roller is put into contact with the surface of the thermal transfer sheet or image-receiving sheet, whereby the surface of the thermal transfer sheet or image-receiving sheet can be cleaned. The contact pressure is not particularly limited insofar as the adhesive roller can contact with the thermal transfer sheet or image-receiving sheet.

The material having tackiness for use on the adhesive roller preferably has a Vickers' hardness Hv of 50 kg/mm$^2$ (=about 490 MPa) or less because dusts as a foreign matter can be satisfactorily removed and the image defect can be prevented.

The Vickers' hardness is a hardness when a static load is imposed on a regular quadrangular pyramid-shaped diamond indentator having a diagonal angle of 136° and the hardness is measured. The Vickers' hardness Hv can be determined by the following formula:

$$Hardness\ Hv=1.854\ P/d^2\ (kg/mm^2)=about\ 18.1692\ P/d^2\ (MPa)$$

wherein
P: the size of load (kg),
d: the length (mm) of a diagonal line of the square recession.

In the present invention, the material having tackiness for use on the adhesive roller preferably has an elastic modulus of 200 kg/cm$^2$ (=about 19.6 MPa) or less at 20° C. because, similarly to the above, dusts as a foreign matter can be satisfactorily removed and the image defect can be prevented.

The absolute value of the difference between the surface roughness Rz on the image-forming layer surface of the thermal transfer sheet and the surface roughness Rz on the surface of the backside layer thereof is preferably 3.0 or less, and the absolute value of the difference between the surface roughness Rz on the image-receiving layer surface of the image-receiving sheet and the surface roughness Rz on the surface of the backside layer thereof is preferably 3.0 or less. By virtue of this construction combined with the above-described cleaning means, the image defects can be prevented, the jamming of sheets on transportation can be prohibited and the dot gain stability can be improved.

The surface roughness Rz as used in the present invention means a ten point average surface roughness corresponding to Rz (maximum height) defined by JIS B 0601 and this is determined as follows. A basic area portion is extracted from the roughness curved surface and using an average face in this portion as the basic face, the distance between the average altitude of projections from the highest to the fifth height and the average depth of troughs from the deepest to the fifth depth is input and converted. For the measurement, a tracer-system three-dimensional roughness meter (Surfcom 570A-3DF) manufactured by Tokyo Seimitsu Co., Ltd. is used. The measured direction is machine direction, the cut-off value is 0.08 mm, the measured area is 0.6 mm×0.4 mm, the feed pitch is 0.005 mm and the measurement speed is 0.12 mm/s.

From the standpoint of more improving the above-described effect, the absolute value of difference between the surface roughness Rz on the image-forming layer surface of the thermal transfer sheet and the surface roughness Rz on the surface of the backside layer thereof is preferably 1.0 or less, and the absolute value of difference between the surface roughness Rz on the image-receiving layer surface of the image-receiving sheet and the surface roughness Rz on the surface of the backside layer thereof is preferably 1.0 or less.

In another embodiment, the image-forming layer surface of the thermal transfer sheet and the surface of the backside layer thereof and/or the front and back surfaces of the image-receiving sheet preferably have a surface roughness Rz of 2 to 30 μm. By having such a construction in combination with the above-described cleaning means, the image defects can be prevented, the jamming of sheets on transportation can be prohibited and the dot gain stability can be improved.

The glossiness on the image-forming layer of the thermal transfer sheet is preferably from 80 to 99.

The glossiness greatly depends on the smoothness on the surface of the image-forming layer and affects the uniformity in the layer thickness of the image-forming layer. With a higher glossiness, the image-forming layer can be more uniform and more suitable for uses of forming a high-definition image, however, if the smoothness is higher, the resistance at the transportation becomes larger. Thus, the glossiness and the smoothness are in a trade-off relationship but these can be balanced when the glossiness is from 80 to 99.

The mechanism of forming an image by the thermal transfer of a thin film using a laser is roughly described below by referring to FIG. 1.

On the surface of an image-forming layer 16 containing a pigment of black (K), cyan (C), magenta (M) or yellow (Y) of a thermal transfer sheet 10, an image-receiving sheet 20 is stacked to prepare an image-forming laminate 30. The thermal transfer sheet 10 comprises a support 12 having thereon a light-to-heat converting layer 14 and further thereon an image-forming layer 16, and the image-receiving sheet 20 comprises a support 22 having thereon an image-receiving layer 24 and is stacked on the thermal transfer sheet 10 such that the image-receiving layer 24 comes into contact with the surface of the image-forming layer 16 (see, FIG. 1(a)). When laser light is imagewise irradiated in time series on the obtained laminate 30 from the support 12 side of the thermal transfer sheet 10, the region irradiated with the laser light of the light-to-heat conversion layer 14 in the thermal transfer sheet 10 generates heat and decreases in the adhesive strength with the image-forming layer 16 (see, FIG. 1(b)). Thereafter, the image-receiving sheet 20 and the thermal transfer sheet 10 are peeled off, then, the region 16' irradiated with the laser light of the image-forming layer 16 is transferred to the image-receiving layer 24 of the image-receiving sheet 20 (see FIG. 1(c)).

In the image formation, the laser light used for the light irradiation is preferably multi-beam laser light, more preferably light of multi-beam two-dimensional arrangement. The multi-beam two-dimensional arrangement means that on performing the recording by laser irradiation, a plurality of laser beams are used and the spot arrangement of these laser beams forms a two-dimensional plane arrangement comprising a plurality of rows along the main scanning direction and a plurality of lines along the sub-scanning direction.

By using the laser light in multi-beam two-dimensional arrangement, the time period necessary for the laser recording can be shortened.

Any laser light can be used without any limitation insofar as it is a multi-beam laser light. For example, gas laser light such as argon ion laser light, helium-neon laser light and helium-cadmium laser light; solid-state laser light such as YAG laser light; or direct laser light such as semiconductor laser light, dye laser light and excimer laser light, is used. In addition, for example, light converted into a half wavelength by passing the above-described laser light through a secondary higher harmonic device may also be used. In the image formation, semiconductor laser light is preferred on considering the output power and easiness in modulation. In the image formation, the laser light is preferably irradiated under the conditions such that the beam diameter is from 5 to 50 μm (particularly from 6 to 30 μm) on the light-to-heat conversion layer. The scanning speed is preferably 1 m/sec or more (particularly 3 m/sec or more).

In the image formation, the thickness of the image-forming layer in the black thermal transfer sheet is preferably larger than that of the image-forming layer in each of yellow, magenta and cyan thermal transfer sheet and is preferably from 0.5 to 0.7 μm. By constructing as such, the reduction in density due to transfer unevenness can be suppressed at the laser irradiation of the black thermal transfer sheet.

If the layer thickness of the image-forming layer in the black thermal transfer sheet is less than 0.5 μm, the image density greatly decreases due to transfer unevenness on recording at a high energy and an image density necessary as a proof of printing may not be achieved. This tendency is more outstanding under high humidity conditions and the change in density increases depending on the environment. On the other hand, if the layer thickness exceeds 0.7 μm, the transfer sensitivity may decrease at the laser recording and poor fixing of small points or thinning of fine lines may result. This tendency is more outstanding under low humidity conditions. Also, the resolution is worsened in some cases. The layer thickness of the image-forming layer in the black thermal transfer sheet is more preferably from 0.55 to 0.65 μm, still more preferably 0.60 μm.

Furthermore, it is preferred that the layer thickness of the image-forming layer in the black thermal transfer sheet is from 0.5 to 0.7 μm and the layer thickness of the image-forming layer in each of the yellow, magenta and cyan thermal transfer sheets is from 0.2 μm to less than 0.5 μm.

If the layer thickness of the image-forming layer in heach of the yellow, magenta and cyan thermal transfer sheets is less than 0.2 μm, the density may decrease due to transfer unevenness at the laser recording, whereas if the layer thickness exceeds 0.5 μm, the transfer sensitivity or resolution may decrease. The layer thickness is more preferably from 0.3 to 0.45 μm.

The image-forming layer in the black thermal transfer sheet preferably contains carbon black. The carbon black preferably comprises at least two kinds of carbon blacks different in the staining power because the reflection density can be adjusted while keeping a constant P/B (pigment/binder) ratio.

The staining power of carbon black is expressed by various methods and, for example, PVC blackness described in JP-A-10-140033 may be used. The PVC blackness is determined as follows. Carbon black is added to PVC resin, dispersed by means of a twin roller and formed into a sheet and by setting the base values while taking the blackness of Carbon Black "#40" and "#45" produced by Mitsubishi Chemical as Point 1 and Point 10, respectively, the blackness of a sample is evaluated by the judgement with an eye. Two or more carbon blacks different in the PVC blackness can be appropriately selected and used according to the purpose.

The method for preparing a sample is specifically described below.

<Preparation Method of Sample>

In a 250 ml-volume Banbury mixer, 40 mass % of a sample carbon black is blended with LDPE (low-density polyethylene) resin and kneaded at 115° C. for 4 minutes.

Blending Conditions:

| | |
|---|---|
| LDPE resin | 101.89 g |
| Calcium stearate | 1.39 g |
| Irganox 1010 | 0.87 g |
| Sample carbon black | 69.43 g |

Then, the kneaded material is diluted at 120° C. by a twin roller mill to a carbon black concentration of 1 mass %.

Conditions in Preparation of Diluting Compound:

| | |
|---|---|
| LDPE resin | 58.3 g |
| Calcium stearate | 0.2 g |
| Resin having blended therein 40 mass % of carbon black | 1.5 g |

The diluted sample is formed into a sheet through a 0.3 mm-width slit and the obtained sheet is cut into chips and formed into a film of 65±3 μm on a hot plate at 240° C.

With respect to the method for forming a multicolor image, a multicolor image may be formed, as described above, by using the thermal transfer sheets and repeatedly superposing a large number of image layers (image-forming layers having formed thereon an image) on the same image-receiving sheet. Also, a multicolor image may be formed by once forming an image on each image-receiving layer of a plurality of image-receiving sheets and re-transferring the images to printing paper or the like.

In the latter case, for example, thermal transfer sheets having an image-forming layer containing a coloring material different in the color hue from each other are prepared and each is combined with an image-receiving sheet to produce four kinds (four colors: cyan, magenta, yellow and black) of laminates for image formation. On each laminate, for example, laser light is irradiated through a color separation filter according to digital signals based on an image and subsequently, the thermal transfer sheet is peeled off from the image-receiving sheet to independently form a color separation image of each color on each image-receiving sheet. Respective color separation images formed are sequentially stacked on a separately prepared actual support such as printing paper or on a support approximated thereto, whereby a multicolor image can be formed.

In the thermal transfer recording using laser light irradiation, the change in the state of pigment, dye or image-forming layer at the transfer is not particularly limited insofar as a laser beam is converted into heat, an image-forming layer containing a pigment is transferred to an image-receiving sheet utilizing the heat energy and an image can be formed on the image-receiving sheet. A solid state, softened state, liquid state or gas state any can be provided but a solid or softened state is preferred. The thermal transfer recording using laser light irradiation includes, for example, conventionally known fusion transfer, ablation transfer and sublimation transfer.

Among these, the above-described thin film transfer and the fusion-ablation are preferred because an image having a color hue analogous to printing can be prepared.

In performing a step of transferring an image-receiving sheet having an image printed by a recording device to a printing paper (hereinafter called a "main paper"), a heat laminator is usually used. When the image-receiving sheet is superposed on a main paper and applied with heat and pressure, these sheet and paper are bonded. Thereafter, by peeling off the image-receiving sheet from the main paper, only an image-receiving layer containing the image remains on the main paper.

When the above-described devices are connected on a plate-making system, a system capable of exerting a function as a color proof can be constructed. The system is required to output, from the recording device, a print having an image quality as close as that of a printed matter output based on certain plate-making data and for realizing this, a software for approximating colors and halftone dots to those of a printed matter is necessary. The connection example is specifically described below.

In the case of preparing a proof of a printed matter from a plate-making system (for example, Celebra manufactured by Fuji Photo Film Co., Ltd.), the system is connected as follows. A CTP (computer-to-plate) system is connected to a plate-making system. A printing plate output therefrom is mounted on a press and a final printed matter is obtained. To the plate-making system, the above-described recording device is connected as a color proof and therebetween, a PD System (registered trademark) for approximating colors and dots to a printed matter is connected as a proof drive software.

The CONTONE (continuous tone) data converted into raster data in the plate-making system are converted into binary data for halftone dots, output to the CTP system and finally printed. On the other hand, the same CONTONE data are output also to the PD System. The PD System converts the received data using a four-dimensional (black, cyan, magenta and yellow) table to give colors agreeing with those of the printed matter and finally converts the data into binary data for halftone dots to give halftone dots agreeing with those of the printed matter. These data are output to the recording device.

The four-dimensional table is previously prepared by performing an experiment and stored in the system. The experiment for the preparation of data is performed as follows. From important color data, an image printed through a CTP system and an image output by the recording device through a PD System are prepared and compared on the measured color values, and a table is prepared such that the difference in the measured color values is minimized.

The thermal transfer sheet and the image-receiving sheet, which are suitably used for the recording device of the above-described system, are described below.

[Thermal Transfer Sheet]

The thermal transfer sheet comprises a support having thereon at least a light-to-heat conversion layer and an image-forming layer and if desired, additionally having other layers.

(Support)

The material for the support of the thermal transfer sheet is not particularly limited and various support materials can be used according to the end use. The support preferably has rigidity, good dimensional stability and durability against heat on the image formation. Preferred examples of the support material include synthetic resin materials such as polyethylene terephthalate, polyethylene-2,6-naphthalate, polycarbonate, polymethyl methacrylate, polyethylene, polypropylene, polyvinyl chloride, polyvinylidene chloride, polystyrene, styrene-acrylonitrile copolymer, polyamide (aromatic or aliphatic), polyimide, polyamidoimide and polysulfone. Among these, biaxially stretched polyethylene terephthalate is preferred in view of the mechanical strength and dimensional stability against heat. In the case of use for the manufacture of a color proof utilizing laser recording, the support of the thermal transfer sheet is preferably formed of a transparent synthetic resin material capable of transmitting laser light. The thickness of the support is preferably from 25 to 130 μm, more preferably from 50 to 120 μm. The center line average surface roughness Ra (measured according to JIS B0601 using a surface roughness meter (Surfcom, manufactured by Tokyo Seimitsu Co., Ltd.)) of the support in the image-forming layer side is preferably less than 0.1 μm. The Young's modulus in the machine direction of the support is preferably from 200 to 1,200 kg/mm$^2$ (=about 2 to 12 GPa) and the Young's modulus in the transverse direction is preferably from 250 to 1,600 kg/mm$^2$ (=about 2.5 to 16 GPa). The F-5 value in the machine direction of the support is preferably from 5 to 50 kg/mm$^2$ (=about 49 to 490 MPa) and the F-5 value in the transverse direction of the support is preferably from 3 to 30 kg/mm$^2$ (=about 29.4 to 294 MPa). The F-5 value in the machine direction of the support is generally higher than the F-5 value in the transverse direction of the support but this does not apply when the strength particularly in the transverse direction must be rendered high. The heat shrinkage rate at 100° C. for 30 minutes in the longitudinal and transverse directions of the support is preferably 3% or less, more preferably 1.5% or less, and the heat shrinkage rate at 80° C. for 30 minutes is preferably 1% or less, more preferably 0.5% or less. The breaking strength is preferably from 5 to 100 kg/mm$^2$ (=about 49 to 980 MPa) in both directions and the elastic modulus is preferably from 100 to 2,000 kg/mm$^2$ (=about 0.98 to 19.6 GPa).

The support of the thermal transfer sheet may be subjected to a surface activation treatment and/or a treatment of providing one or more undercoat layer so as to improve the adhesive property to the light-to-heat conversion layer provided thereon. Examples of the surface activation treatment include a glow discharge treatment and a corona discharge treatment. The material for the undercoat layer preferably exhibits high adhesive property to the surfaces of both the support and the light-to-heat conversion layer and has small heat conductivity and excellent heat resistance. Examples of such a material for the undercoat layer include styrene, a styrene-butadiene copolymer and gelatin. The thickness of the entire undercoat layer is usually from 0.01 to 2 μm. If desired, the surface of the thermal transfer sheet in the side opposite the side where the light-to-heat conversion layer is provided may be subjected to a treatment of providing various functional layers such as antireflection layer and antistatic layer, or to a surface treatment.

(Back Layer)

A back layer is preferably provided on the surface of the thermal transfer sheet of the present invention in the side opposite the side where the light-to-heat conversion layer is provided. The back layer is preferably constructed by two layers, namely, a first back layer adjacent to the support and a second back layer provided on the first back layer in the side opposite the support. In the present invention, the ratio B/A of the mass A of the antistatic agent contained in the first back layer to the mass B of the antistatic agent contained in the second back layer is preferably less than 0.3. If the B/A ratio is 0.3 or more, sliding property and powder-falling off from the back layer are liable to change for the worse.

The layer thickness C of the first back layer is preferably from 0.01 to 1 μm, more preferably from 0.01 to 0.2 μm. The layer thickness D of the second back layer is preferably from 0.01 to 1 μm, more preferably from 0.01 to 0.2 μm. The ratio C:D in the film thickness between these first and second back layers is preferably from 1:2 to 5:1.

Examples of the antistatic agent which can be used in the first and second back layers include nonionic surfactants such as polyoxyethylene alkylamine and glycerol fatty acid ester, cationic surfactants such as quaternary ammonium salt, anionic surfactants such as alkyl phosphate, amphoteric surfactants, and compounds such as electrically conducting resin.

An electrically conducting fine particle can also be used as the antistatic agent. Examples of the electrically conducting fine particle include oxides such as ZnO, $TiO_2$, $SnO_2$, $Al_2O_3$, $In_2O_3$, MgO, BaO, CoO, CuO, $Cu_2O$, CaO, SrO, $BaO_2$, PbO, $PbO_2$, $MnO_3$, $MoO_3$, $SiO_2$, $ZrO_2$, $Ag_2O$, $Y_2O_3$, $Bi_2O_3$, $Ti_2O_3$, $Sb_2O_3$, $Sb_2O_5$, $K_2Ti_6O_{13}$, $NaCaP_2O_{18}$ and $MgB_2O_5$; sulfides such as CuS and ZnS; carbides such as SiC, TiC, ZrC, VC, NbC, MoC and WC; nitrides such as $Si_3N_4$, TiN, ZrN, VN, NbN and $Cr_2N$; borides such as $TiB_2$, $ZrB_2$, $NbB_2$, $TaB_2$, CrB, MoB, WB and $LaB_5$; silicides such as $TiSi_2$, $ZrSi_2$, $NbSi_2$, $TaSi_2$, $CrSi_2$, $MoSi_2$ and $WSi_2$; metal salts such as $BaCO_3$, $CaCO_3$, $SrCO_3$, $BaSO_4$ and $CaSO_4$; and composite materials such as $SiN_4$—SiC and $9Al_2O_3$-$2B_2O_3$. These particles may be used individually or in combination of two or more thereof. Among these, $SnO_2$, ZnO, $Al_2O_3$, $TiO_2$, $In_2O_3$, MgO, BaO and $MoO_3$ are preferred, $SnO_2$, ZnO, $In_2O_3$ and $TiO_2$ are more preferred, and $SnO_2$ is still more preferred.

In the case of using the thermal transfer material of the present invention in the laser thermal transfer recording system, the antistatic agent used in the back layer is preferably substantially transparent so that the laser light can be transmitted therethrough.

In the case of using an electrically conducting metal oxide as the antistatic agent, the particle size thereof is preferably smaller so as to reduce the light scattering as much as possible, however, the particle size must be determined using the ratio in the refractive index between the particle and the binder as a parameter and can be determined using the Mie Scattering Theory. The average particle size is generally from 0.001 to 0.5 μm, preferably from 0.003 to 0.2 μm. The average particle size as used herein is a value including not only a primary particle size of the electrically conducting metal oxide but also a particle size of (hkl) structures.

In addition to the antistatic agent, various additives such as surfactant, sliding agent and matting agent, or a binder may be added to the first and second back layers. The amount of the antistatic agent contained in the first back layer is preferably from 10 to 1,000 parts by mass (i.e., by weight), more preferably from 200 to 800 parts by mass, per 100 parts by mass (i.e., by weight) of the binder. The amount of the antistatic agent contained in the second back layer is preferably from 0 to 300 parts by mass, more preferably from 0 to 100 parts by mass, per 100 parts by mass of the binder.

Examples of the binder which can be used in the formation of first and second back layers include homopolymers and copolymers of acrylic acid-based monomers such as acrylic acid, methacrylic acid, acrylic acid ester and methacrylic acid ester; cellulose-based polymers such as nitrocellulose, methyl cellulose, ethyl cellulose and cellulose acetate; vinyl-based polymers and copolymers of vinyl compounds, such as polyethylene, polypropylene, polystyrene, vinyl chloride-based copolymer, vinyl chloride-vinyl acetate copolymer, polyvinylpyrrolidone, polyvinyl butyral and polyvinyl alcohol; condensed polymers such as polyester, polyurethane and polyamide; rubber-based thermoplastic polymers such as butadiene-styrene copolymer; polymers resulting of polymerization or crosslinking of a photopolymerizable or thermopolymerizable compound such as epoxy compound; and melamine compounds.

(Light-to-Heat Conversion Layer)

The light-to-heat conversion layer contains a light-to-heat conversion substance and a vinylpyrrolidone polymer and/or a vinylpyrrolidone copolymer and additionally contains a main binder usable in combination, other binder (hereinafter, in the case of generically calling these binders, simply referred to as "a binder") and if desired, a matting agent. Furthermore, if desired, the light-to-heat conversion layer contains other components.

The light-to-heat conversion substance is a substance having a function of converting light energy on irradiation into heat energy. This substance is generally a dye (including a pigment, hereinafter the same) capable of absorbing laser light. In the case of performing the image recording using an infrared laser, an infrared absorbing dye is preferably used as the light-to-heat conversion substance. Example of the dye include black pigments such as carbon black; pigments formed of a macrocyclic compound having absorption in the region from visible to near infrared, such as phthalocyanine and naphthalocyanine; organic dyes used as a laser-absorbing material in the high-density laser recording of an optical disk or the like, such as cyanine dyes (e.g., indolenine dye), anthraquinone-based dyes, azulene-based dyes and phthalocyanine-based dyes; and organometallic compound dyes such as dithiol-nickel complex. Among these, cyanine-based dyes are preferred because this dye exhibits a high absorption coefficient to light in the infrared region and when used as a light-to-heat conversion substance, the thickness of the light-to-heat conversion layer can be reduced, as a result, the recording sensitivity of the thermal transfer sheet can be more improved.

Other than the dye, particulate metal materials such as blackened silver, and inorganic materials may also be used as the light-to-heat conversion substance.

The binder contained in the light-to-heat conversion layer is preferably a resin having at least a strength sufficiently large to form a layer on a support and having a high heat conductivity. A resin having heat resistance and being capable of not decomposing even by the heat generated from the light-to-heat conversion substance on image recording is more preferred because even when light irradiation of higher energy is performed, the smoothness on the surface of the light-to-heat conversion layer can be maintained after the light irradiation. More specifically, a resin having a thermal decomposition temperature (a temperature of giving decrement of 5 mass % according to the TGA method (thermogravimetric analysis) in an air stream at a temperature-rising rate of 10° C./min) of 400° C. or more is preferred and a resin having the thermal decomposition temperature of 500° C. or more is more preferred. Also, the binder preferably has a glass transition temperature of 200 to 400° C., more preferably from 250 to 350° C. If the glass transition temperature is less than 200° C., fogging may be generated on the formed image, whereas if it exceeds 400° C., the solubility of the resin decreases and the production efficiency may be lowered.

The heat resistance (for example, thermal deformation temperature or thermal decomposition temperature) of the binder in the light-to-heat conversion layer is preferably high as compared with the materials used in other layers provided on the light-to-heat conversion layer.

Specific examples of the binder which can be a main binder or can be used in combination with the main binder or the vinylpyrrolidone polymer and/or vinylpyrrolidone copolymer include acrylic acid-based resins (e.g., polymethyl methacrylate), polycarbonate, polystyrene, vinyl-based resins (e.g., vinyl chloride/vinyl acetate copolymer, polyvinyl alcohol), polyvinyl butyral, polyester, polyvinyl chloride, polyamide (including aromatic polyamide and aliphatic polyamide), polyimide, polyether imide, polysulfone, polyether sulfone, polyurethane, epoxy resin and urea/melamine resin. Among these, polyamide resin and polyimide resin are preferred.

In particular, the polyimide resins represented by the following formulae (I) to (VII) are preferred because these are soluble in an organic solvent and when these polyimide resins are used, the productivity of the thermal transfer sheet is improved. These resins are also preferred because the coating solution for the light-to-heat conversion layer is improved in the viscosity stability, long-term storability and humidity resistance.

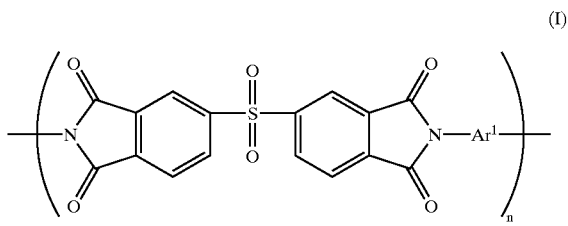

(I)

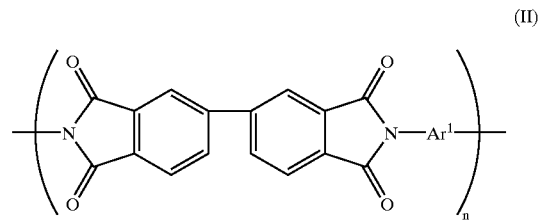

(II)

wherein $Ar^1$ represents an aromatic group represented by the following structural formula (1), (2) or (3), and n represents an integer of 10 to 100:

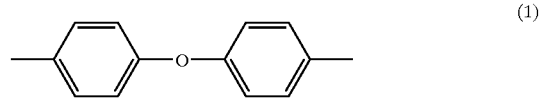

(1)

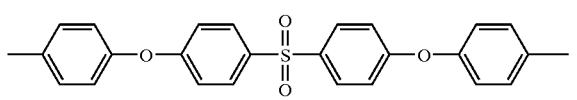

(2)

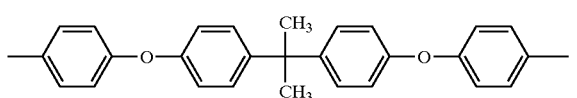

(3)

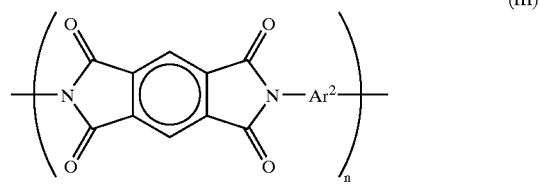

(III)

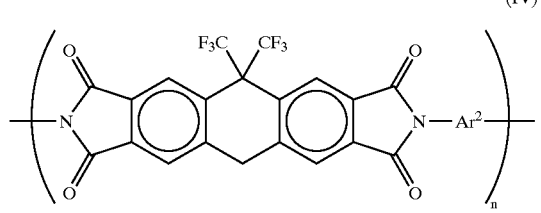

(IV)

wherein Ar² represents an aromatic group represented by the following formula (4), (5), (6) or (7), and n represents an integer of 10 to 100:

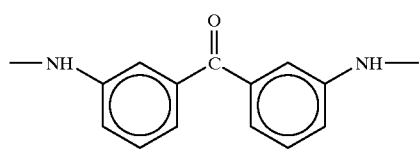

(4)

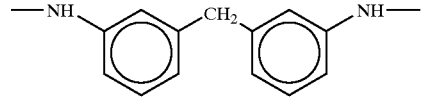

(5)

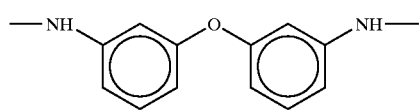

(6)

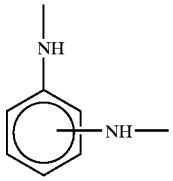

(7)

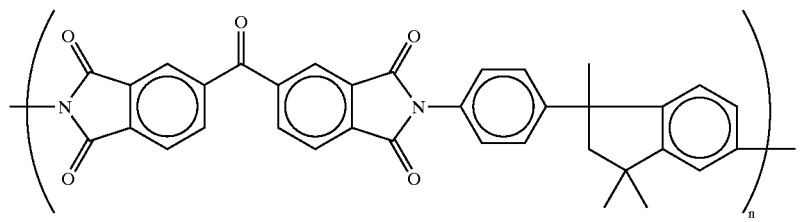

(V)

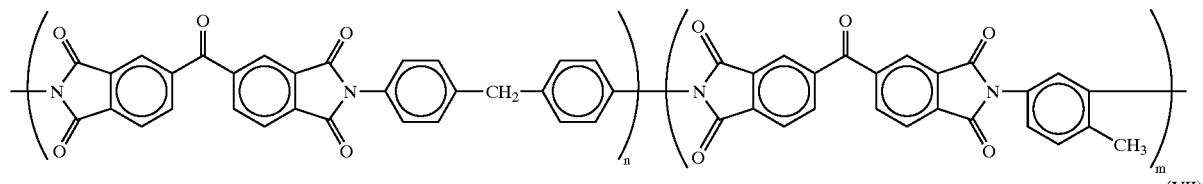

(VI)

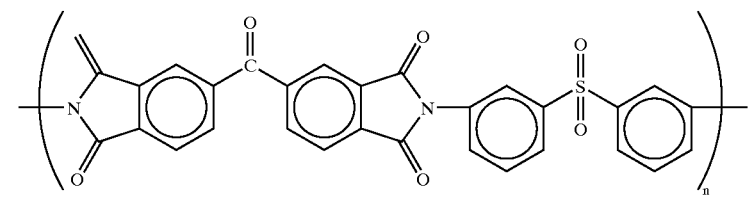

(VII)

wherein in formulae (V) to (VII), n and m each represents an integer of 10 to 100, and in formula (VI), the ratio n:m is from 6:4 to 9:1.

Examples of the polyamide resin include methoxymethylated nylon, polyacrylamide, polyamidoimide, nylon 6, nylon 6,6, nylon 12 and these resins elevated in the solubility by the copolymerization.

As for the standard for the judgement whether or not the resin is soluble in an organic solvent, on the basis that 10 parts by mass or more of resin dissolves at 25° C. per 100 parts by mass of N-methylpyrrolidone, when 10 parts by mass or more is dissolved, the resin is preferably used as the resin for the light-to-heat conversion layer. When 100 parts by mass or more is dissolved per 100 parts by mass of N-methylpyrrolidone, this resin is more preferred.

Examples of the matting agent include inorganic fine particle and organic fine particle. Examples of the inorganic fine particle include metal salts such as silica, titanium oxide, aluminum oxide, zinc oxide, magnesium oxide, barium sulfate, magnesium sulfate, aluminum hydroxide, magnesium hydroxide and boron nitride, kaolin, clay, talc, zinc white, white lead, zieklite, quartz, diatomite, pearlite, bentonite, mica and synthetic mica. Examples of the organic fine particle include olefin-based resin particle such as polystyrene and polyethylene, fluororesin particle, guanamine resin particle, acrylic resin particle such as polymethyl methacrylate, styrene-acryl copolymer resin particle, silicone resin particle, melamine resin particle and epoxy resin particle. In the case of a polymer matting agent, polymers where a so-called three-dimensional network structure is formed by the crosslinking or the like so as to prevent dissolution by the solvent in the coating solution are also preferred. Among these, matting agents having a small interaction with a vinylpyrrolidone polymer or a copolymer thereof are preferred because the crosslinking coagulation with the vinylpyrrolidone polymer or a copolymer thereof hardly occurs.

The shape is not particularly limited and a matting agent having, for example, a spherical form, an amorphous form or a cubic form can be used.

The particle size of the matting agent is usually from 0.3 to 30 μm, preferably from 0.5 to 20 μm, and the amount of the matting agent added in the light-to-heat conversion layer is usually 0.1 to 100 mg/m$^2$ (per area occupied by the light-to-heat conversion layer), preferably from 0.5 to 70 mg/m$^2$.

The light-to-heat conversion layer may contain, if desired, a surfactant, a thickener, an antistatic agent and the like.

The light-to-heat conversion layer can be provided by preparing a coating solution having dissolved therein a light-to-heat conversion substance and a binder and if desired, having added thereto other components, applying the coating solution onto a support and drying the solution. Examples of the organic solvent for dissolving the polyimide resin include n-hexane, cyclohexane, diglyme, xylene, toluene, ethyl acetate, tetrahydrofuran, methyl ethyl ketone, acetone, cyclohexanone, 1,4-dioxane, 1,3-dioxane, dimethyl acetate, N-methyl-2-pyrrolidone, dimethylsulfoxide, dimethylformamide, dimethylacetamide, γ-butyrolactone, ethanol and methanol. The coating and drying may be performed using ordinary coating and drying methods. The drying is usually performed at a temperature of 300° C. or less, preferably at a temperature of 200° C. or less. In the case where polyethylene terephthalate is used as the support, the drying is preferably performed at a temperature of 80 to 150° C.

If the amount of the binder in the light-to-heat conversion layer is excessively small, the cohesion of the light-to-heat conversion layer decreases and at the time of transferring a formed image to an image-receiving sheet, the light-to-heat conversion layer is readily transferred together and this causes color mixing of the image, whereas if the polyimide resin is in an excessively large amount, the layer thickness of the light-to-heat conversion layer increases so as to achieve a constant light absorptivity and this readily incurs reduction in sensitivity. The mass ratio (i.e., weight ratio) as solid content between the light-to-heat conversion substance and the binder in the light-to-heat conversion layer is preferably from 1:20 to 2:1, more preferably from 1:10 to 2:1.

As described above, reduction in the thickness of the light-to-heat conversion is preferred because the sensitivity of the thermal transfer sheet can be elevated. The thickness of the light-to-heat conversion layer is preferably from 0.03 to 1.0 μm, more preferably from 0.05 to 0.5 μm. Furthermore, the light-to-heat conversion layer preferably has an optical density of 0.80 to 1.49, more preferably from 0.92 to 1.15, for the light at a wavelength of 808 nm, whereby the image-forming layer can be improved in the transfer sensitivity. If the optical density at a laser peak wavelength is less than 0.80, the irradiated light is insufficiently converted into heat and the transfer sensitivity lowers in some cases. On the other hand, if it exceeds 1.49, this affects the function of the light-to-heat conversion layer on recording and fogging may be generated.

(Image-Forming Layer)

The image-forming layer contains at least a pigment which is transferred to an image-receiving sheet and forms an image, and further contains a binder for forming the layer and if desired, other components.

The pigment in general is roughly classified into an organic pigment and an inorganic pigment. These are appropriately selected according to the use end by taking account of their properties, that is, the former provides a coating film having high transparency and the latter generally exhibits excellent masking property. In the case of using the thermal transfer sheet for a color proof in printing, an organic pigment having a color agreeing with or close to yellow, magenta, cyan or black printing ink employed in general is used. Other than these, a metal powder, a fluorescent pigment or the like is used in some cases. Examples of the pigment which is suitably used include azo-type pigments, phthalocyanine-type pigments, anthraquinone-type pigments, dioxazine-type pigments, quinacridone-type pigments, isoindolinone-type pigments and nitro-type pigments. The pigments for use in the image-forming layer, classified by the hue, are described below, however, the present invention is not limited thereto.

1) Yellow Pigment

Pigment Yellow 12 (C.I. No. 21090):
Permanent Yellow DHG (produced by Clariant Japan), Lionol Yellow 1212B (produced by Toyo Ink Mfg. Co., Ltd.), Irgalite Yellow LCT (produced by Ciba Specialty Chemicals), Symuler Fast Yellow GTF 219 (produced by Dainippon Ink & Chemicals Inc.)

Pigment Yellow 13 (C.I. No. 21100):
Permanent Yellow GR (produced by Clariant Japan), Lionol Yellow 1313 (produced by Toyo Ink Mfg. Co., Ltd.)

Pigment Yellow 14 (C.I. No. 21095):
Permanent Yellow G (produced by Clariant Japan), Lionol Yellow 1401-G (produced by Toyo Ink Mfg. Co., Ltd.), Seika Fast Yellow 2270 (produced by Dainichi Seika Kogyo), Symuler Fast Yellow 4400 (produced by Dainippon Ink & Chemicals Inc.)

Pigment Yellow 17 (C.I. No. 21105):
Permanent Yellow GG02 (produced by Clariant Japan), Symuler Fast Yellow 8GF (produced by Dainippon Ink & Chemicals Inc.)

Pigment Yellow 155:
Graphtol Yellow 3GP (produced by Clariant Japan) Pigment Yellow 180 (C.I. No. 21290):
Novoperm Yellow P-HG (produced by Clariant Japan), PV Fast Yellow HG (produced by Clariant Japan)

Pigment Yellow 139 (C.I. No. 56298):
Novoperm Yellow M2R 70 (produced by Clariant Japan)

2) Magenta Pigment

Pigment Red 57:1 (C.I. No. 15850:1):
Graphtol Rubine L6B (produced by Clariant Japan), Lionol Red 6B-4290G (produced by Toyo Ink Mfg. Co., Ltd.), Irgalite Rubine 4BL (produced by Ciba Specialty Chemicals), Symuler Brilliant Carmine 6B-229 (produced by Dainippon Ink & Chemicals Inc.)

Pigment Red 122 (C.I. No. 73915):
Hosterperm Pink E (produced by Clariant Japan), Lionogen Magenta 5790 (produced by Toyo Ink Mfg. Co., Ltd.), Fastogen Super Magenta RH (produced by Dainippon Ink & Chemicals Inc.)

Pigment Red 53:1 (C.I. No. 15585:1):
Permanent Lake Red LCY (produced by Clariant Japan), Symuler Lake Red C conc (produced by Dainippon Ink & Chemicals Inc.)

Pigment Red 48:1 (C.I. No. 15865:1):
Lionol Red 2B 3300 (produced by Toyo Ink Mfg. Co., Ltd.), Symuler Red NRY (produced by Dainippon Ink & Chemicals Inc.)

Pigment Red 48:2 (C.I. No. 15865:2):
Permanent Red W2T (produced by Clariant Japan), Lionol Red LX235 (produced by Toyo Ink Mfg. Co., Ltd.), Symuler Red 3012 (produced by Dainippon Ink & Chemicals Inc.)

Pigment Red 48:3 (C.I. No. 15865:3):
  Permanent Red 3RL (produced by Clariant Japan), Symuler Red 2BS (produced by Dainippon Ink & Chemicals Inc.)
Pigment Red 177 (C.I. No. 65300):
  Cromophtal Red A2B (produced by Ciba Specialty Chemicals)
3) Cyan Pigment:
Pigment Blue 15 (C.I. No. 74160):
  Lionol Blue 7027 (produced by Toyo Ink Mfg. Co., Ltd.), Fastogen Blue BB (produced by Dainippon Ink & Chemicals Inc.)
Pigment Blue 15:1 (C.I. No. 74160):
  Hosterperm Blue A2R (produced by Clariant Japan), Fastgen Blue 5050 (produced by Dainippon Ink & Chemicals Inc.)
Pigment Blue 15:2 (C.I. No. 74160):
  Hosterperm Blue AFL (produced by Clariant Japan), Irgalite Blue BSP (produced by Ciba Specialty Chemicals), Fastgen Blue GP (produced by Dainippon Ink & Chemicals Inc.)
Pigment Blue 15:3 (C.I. No. 74160):
  Hosterperm Blue B2G (produced by Clariant Japan), Lionol Blue FG7330 (produced by Toyo Ink Mfg. Co., Ltd.), Cromophtal Blue 4GNP (produced by Ciba Specialty Chemicals), Fastgen Blue FGF (produced by Dainippon Ink & Chemicals Inc.)
Pigment Blue 15:4 (C.I. No. 74160):
  Hosterperm Blue BFL (produced by Clariant Japan), Cyanine Blue 700-10FG (produced by Toyo Ink Mfg. Co., Ltd.), Irgalite Blue GLNF (produced by Ciba Specialty Chemicals), Fastgen Blue FGS (produced by Dainippon Ink & Chemicals Inc.)
Pigment Blue 15:6 (C.I. No. 74160):
  Lionol Blue ES (produced by Toyo Ink Mfg. Co., Ltd.)
Pigment Blue 60 (C.I. No. 69800):
  Hosterperm Blue RL01 (produced by Clariant Japan), Lionogen Blue 6501 (produced by Toyo Ink Mfg. Co., Ltd.)
4) Black Pigment
Pigment Black 7 (Carbon Black C.I. No. 77266):
  Mitsubishi Carbon Black MA100 (produced by Mitsubishi Chemical), Mitsubishi Carbon Black #5 (produced by Mitsubishi Chemical), Black Pearls 430 (produced by Cabot Co.)

The pigment which can be used in the present invention can be appropriately selected from commercially available products by referring to, for example, *Ganryo Binran* (*Handbook of Pigments*), compiled by Nippon Ganryo Gijutsu Kyokai, Seibundo Shinkosha (1989), and *Color Index*, The Society of Dyes & Colorist, 3rd ed. (1987).

The average particle size of the pigment is preferably from 0.03 to 1 μm, more preferably from 0.05 to 0.5 μm.

If the particle size is less than 0.03 μm, increase in the dispersion cost or gelling of the dispersion solution may occur, whereas if the particle size exceeds 1 μm, coarse pigment particles in the pigment may inhibit the adhesion between the image-forming layer and the image-receiving layer or may inhibit the transparency of the image-forming layer.

The binder for the image-forming layer is preferably an amorphous organic high molecular polymer having a softening point of 40 to 150° C. Examples of the amorphous organic high molecular polymer include butyral resin, polyamide resin, polyethyleneimine resin, sulfonamide resin, polyester polyol resin, petroleum resin, homopolymers and copolymers of styrene or a derivative or substitution product thereof (e.g., styrene, vinyl toluene, α-methylstyrene, 2-methylstyrene, chlorostyrene, vinylbenzoic acid, sodium vinylbenzenesulfonate, aminostyrene), and homopolymers and copolymers with another monomer of a vinyl-based monomer such as methacrylic acid esters (e.g., methyl methacrylate, ethyl methacrylate, butyl methacrylate, hydroxyethyl methacrylate), methacrylic acid, acrylic acid esters (e.g., methyl acrylate, ethyl acrylate, butyl acrylate, α-ethylhexyl acrylate), acrylic acid, dienes (e.g., butadiene, isoprene), acrylonitrile, vinyl ethers, maleic acid, maleic acid esters, maleic anhydride, cinnamic acid, vinyl chloride and vinyl acetate. These resins may be used in combination of two or more thereof.

The image-forming layer preferably contains the pigment in an amount of 30 to 70 mass %, more preferably from 30 to 50 mass %. Also, the image-forming layer preferably contains the resin in an amount of 70 to 30 mass %, more preferably from 70 to 40 mass %.

The image-forming layer may contain the following components (1) to (3) as other components.
(1) Waxes The waxes include mineral waxes, natural waxes and synthetic waxes. Examples of the mineral waxes include petroleum waxes such as paraffin wax, microcrystalline wax, ester wax and oxidized wax; montan wax; ozokerite; and ceresine. Among these, paraffin wax is preferred. The paraffin wax is separated from petroleum and various products different in the melting point are available on the market.

Examples of the natural waxes include plant waxes such as carnauba wax, Japan wax, ouriculy was and espal wax, and animal waxes such as beeswax, insect wax, shellac wax and spermaceti wax.

The synthetic wax is generally used as a lubricant and usually comprises a higher fatty acid-based compound. Examples of the synthetic waxes include the followings.
1) Fatty Acid Wax Linear saturated fatty acids represented by the following formula:

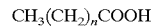

$$CH_3(CH_2)_nCOOH$$

wherein n represents an integer of 6 to 28. Specific examples thereof include a stearic acid, a behenic acid, a palmitic acid, a 12-hydroxystearic acid and an azelaic acid.

In addition, metal salts (e.g., K, Ca, Zn, Mg) of the above-describe fatty acids can be used.
2) Fatty Acid Ester Wax Specific examples of the ester of the above-described fatty acids include ethyl stearate, lauryl stearate, ethyl behenate, hexyl behenate and behenyl myristate.
3) Fatty Acid Amide Wax Specific examples of the amide of the above-described fatty acids include stearic acid amide and lauric acid amide.
4) Aliphatic Alcohol Wax Linear saturated aliphatic alcohols represented by the following formula:

$$CH_3(CH_2)_nOH$$

wherein n represents an integer of 6 to 28.

Specific examples thereof include stearyl alcohol.

Among these synthetic waxes 1) to 4), higher fatty acid amides such as stearic acid amide and lauric acid amide are preferred. The above-described wax compounds may be used, if desired, individually or in appropriate combination.
(2) Plasticizer The plasticizer is preferably an ester compound and examples thereof include phthalic acid esters such as dibutyl phthalate, di-n-octyl phthalate, di(2-ethylhexyl) phthalate, dinonyl phthalate, dilauryl phthalate, butyllauryl phthalate and butylbenzyl phthalate; aliphatic dibasic acid esters such as di(2-ethylhexyl) adipate and di(2-ethylhexyl) sebacate; phosphoric acid triesters such as tricresyl phosphate and tri(2-ethylhexyl) phosphate; polyol polyesters such as polyethylene glycol ester; and epoxy compounds such as epoxy fatty acid ester. These plasticizers are known. Among these, esters of vinyl monomer, particularly esters of acrylic acid or methacrylic acid, are preferred because when added, a large effect can be obtained in the improvement of transfer sensitivity or transfer unevenness and in the control of elongation to break.

Examples of the ester compound of acrylic acid or methacrylic acid include polyethylene glycol dimethacrylate, 1,2,4-butanetriol trimethacrylate, trimethylolethane triacrylate, pentaerythritol acrylate, pentaerythritol tetraacrylate and dipentaerythritol polyacrylate.

The plasticizer may be a polymer. In particular, polyester is preferred because of its great addition effect and difficult diffusibility under storage conditions. Examples of the polyester include sebacic acid-based polyester and adipic acid-based polyester.

The additives contained in the image-forming layer are not limited to those described above. The plasticizers may be used individually or in combination of two or more thereof.

If the content of the additives in the image-forming layer is excessively large, the resolution of the transfer image may decrease, the layer strength of the image-forming layer itself may decrease or due to reduction in the adhesive strength between the light-to-heat conversion layer and the image-forming layer, an unexposed area may be transferred to the image-receiving sheet. In view of these points, the wax content is preferably from 0.1 to 30 mass % (i.e., weight %), more preferably from 1 to 20 mass %, based on the entire solid content in the image-forming layer. The plasticizer content is preferably from 0.1 to 20 mass %, more preferably from 0.1 to 10 mass %, based on the entire solid content in the image-forming layer.

(3) Others

In addition to the above-described components, the image-forming layer may contain a surfactant, an inorganic or organic fine particle (e.g., metal powder, silica gel), an oil (e.g., linseed oil, mineral oil), a thickener, an antistatic agent and the like. Except for the case of obtaining a black image, when a substance capable of absorbing light at the wavelength of the light source used in the image recording is incorporated, the energy necessary for the transfer can be reduced. The substance capable of absorbing light at the wavelength of the light source may be either a pigment or a dye, however, in the case of obtaining a color image, it is preferred in view of color reproduction to use an infrared light source such as semiconductor laser for the image recording and use a dye having small absorption in the visible region and large absorption at the wavelength of the light source. Examples of the near infrared dye include the compounds described in JP-A-3-103476.

The image-forming layer can be provided by preparing a coating solution having dissolved or dispersed therein the pigment, the binder and the like, applying the coating solution onto a light-to-heat conversion layer (when a heat-sensitive peeling layer which is described later is provided on the light-to-heat conversion layer, on the heat-sensitive peeling layer), and drying the solution. Examples of the solvent used in the preparation of the coating solution include n-propyl alcohol, methyl ethyl ketone, propylene glycol monomethyl ether (MFG), methanol and water. The coating and the drying can be performed using ordinary coating and drying methods.

On the light-to-heat conversion layer of the thermal transfer sheet, a heat-sensitive peeling layer containing a heat-sensitive material which generates a gas or releases adhered water or the like under the action of heat generated from the light-to-heat conversion layer and thereby weakens the bonding strength between the light-to-heat conversion layer and the image-forming layer, may be provided. For the heat-sensitive material, a compound (a polymer or a low molecular compound) capable of decomposing or denaturing by itself due to heat and generating a gas, a compound (a polymer or a low molecular compound) having absorbed or adsorbed therein a fairly large amount of an easily vaporizable gas such as moisture, or the like may be used. These compounds may be used in combination.

Examples of the polymer capable of decomposing or denaturing due to heat and generating a gas include self-oxidizing polymers such as nitrocellulose; halogen-containing polymers such as chlorinated polyolefin, chlorinated rubber, polychlorinated rubber, polyvinyl chloride and polyvinylidene chloride; acrylic polymers such as polyisobutyl methacrylate having adsorbed therein a volatile compound (e.g., moisture); cellulose esters such as ethyl cellulose having adsorbed therein a volatile compound (e.g., moisture); and natural polymer compounds such as gelatin having adsorbed therein a volatile compound (e.g., moisture). Examples of the low molecular compound capable of decomposing or denaturing due to heat and generating a gas include compounds which undergo an exothermic decomposition and thereby generate a gas, such as diazo compound and azide compound.

The temperature at which the heat-sensitive material decomposes or denatures due to heat is preferably 280° C. or less, more preferably 230° C. or less.

In the case of using a low molecular compound as the heat-sensitive material of the heat-sensitive peeling layer, the compound is preferably combined with a binder. The binder used here may be the above-described polymer capable of decomposing or denaturing by itself due to heat and generating a gas, but an ordinary binder lacking in such property may also be used. In the case of using the heat-sensitive low molecular compound in combination with a binder, the mass ratio of the former to the latter is preferably from 0.02:1 to 3:1, more preferably from 0.05:1 to 2:1. The heat-sensitive peeling layer preferably covers almost the entire surface of the light-to-heat conversion layer. The thickness thereof is generally from 0.03 to 1 $\mu$m, preferably from 0.05 to 0.5 $\mu$m.

In the case of a thermal transfer sheet having a construction such that a light-to-heat conversion layer, a heat-sensitive peeling layer and an image-forming layer are stacked in this order on a support, the heat-sensitive peeling layer undergoes decomposition or denaturing due to heat transmitted from the light-to-heat conversion layer and generates a gas. By this decomposition or generation of gas, the heat-sensitive peeling layer is partially lost or a cohesive failure takes place within the heat-sensitive peeling layer, as a result, the bonding strength between the light-to-heat conversion layer and the image-forming layer decreases. Accordingly, depending on the behavior of the heat-sensitive peeling layer, a part of the heat-sensitive peeling layer may adhere to the image-forming layer and appear on the finally formed image, giving rise to color mixing of the image. Because of this, in order to ensure that color mixing is not visually perceivable in the formed image even if the above-described transfer of the heat-sensitive peeling layer takes place, the heat-sensitive peeling layer is preferably almost colorless, that is, highly transmissive to visible light.

Specifically, the light absorption coefficient of the heat-sensitive peeling layer is, for visible light, 50% or less, preferably 10% or less.

The thermal transfer sheet may also have a construction such that in place of independently forming the heat-sensitive peeling layer, the above-described heat-sensitive material is added to the coating solution for the light-to-heat conversion layer and the formed light-to-heat conversion layer serves as a light-to-heat conversion layer and as a heat-sensitive peeling layer at the same time.

The outermost layer of the thermal transfer sheet in the side where the image-forming layer is provided preferably has a static friction coefficient of 0.35 or less, more preferably 0.20 or less. When the outermost layer is rendered to have a static friction coefficient of 0.35 or less, the roll can be prevented from contamination at the time of transporting the thermal transfer sheet and the formed image can have high quality. The coefficient of static friction is measured according to the method described in JP-A-2001-47753, paragraph (0011).

The Smooster value on the surface of the image-forming layer is preferably from 0.5 to 50 mmHg (=about 0.0665 to 6.65 kPa) at 23° C. and 55% RH and at the same time, the Ra value is preferably from 0.05 to 0.4 $\mu$m. With these values, a large number of microscopic voids formed on the contact surface to inhibit the contact between the image-receiving layer and the image-forming layer can be reduced and this is advantageous in view of transfer and in turn image quality. The Ra value can be measured according to JIS B0601 using a surface roughness meter (Surfcom, manufactured by Tokyo Seimitsu Co., Ltd.). The surface hardness of the image-forming layer is preferably 10 g or more with a sapphire needle. One second after the earth connection of the thermal transfer sheet which is electrified according to U.S. Federal Test Standard 4046, the charge potential of the image-forming layer is preferably from –100 to 100 V. The surface resistance of the image-forming layer is preferably $10^9$ $\Omega$ or less at 23° C. and 55% RH.

The image-receiving sheet which is used in combination with the above-described thermal transfer sheet is described below.

[Image-Receiving Sheet]
(Layer Construction)

The image-receiving sheet usually has a construction such that one or more image-receiving layer is provided on a support and if desired, one or more of a cushion layer, a peeling layer and an interlayer is provided between the support and the image-receiving layer. In view of the transportation, the image-receiving sheet preferably has a back layer on the surface of the support in the side opposite the image-receiving layer.

(Support)

Examples of the support include normal sheet-form substrates such as plastic sheet, metal sheet, glass sheet, resin coated paper, paper and various composite materials. Examples of the plastic sheet include polyethylene terephthalate sheet, polycarbonate sheet, polyethylene sheet, polyvinyl chloride sheet, polyvinylidene chloride sheet, polystyrene sheet, styrene-acrylonitrile sheet and polyester sheet. Examples of the paper include printing paper and coated paper.

The support preferably has fine voids because the image quality can be improved, and this support can be manufactured as follows. For example, a thermoplastic resin and a filler comprising an inorganic pigment, a polymer incompatible with the thermoplastic resin and the like are mixed, the obtained mixture melt is formed into a single-layer or multi-layer film using a melt extruder and the film is uniaxially or biaxially stretched. In this case, the void percentage is determined by the resin and filler selected, the mixing ratio, the stretching conditions and the like.

As the thermoplastic resin, polyolefin resins such as polypropylene, and polyethylene terephthalate resins are preferred because of their high crystallinity, good stretching property and easiness in the formation of voids. It is preferred to use the polyolefin resin or polyethylene terephthalate resin as the main component and appropriately use a small amount of another thermoplastic resin in combination. The inorganic pigment used as the filler preferably has an average particle size of 1 to 20 $\mu$m and examples of the inorganic pigment which can be used include calcium carbonate, clay, diatomite, titanium oxide, aluminum hydroxide and silica. As for the incompatible resin used as the filler, in the case where the thermoplastic resin used is polypropylene, polyethylene terephthalate is preferably used in combination as the filler. The support having fine voids is described in detail in JP-A-2001-105752.

In the support, the content of the filler such as inorganic pigment is generally on the order of 2 to 30% by volume.

In the image-receiving sheet, the thickness of the support is usually from 10 to 400 $\mu$m, preferably from 25 to 200 $\mu$m. The surface of the support may be subjected to a surface treatment such as corona discharge treatment or glow discharge treatment so as to elevate the adhesive property with the image-receiving layer (or cushion layer) or to elevate the adhesive property with the image-forming layer of the thermal transfer sheet.

(Image-Receiving Layer)

Since the image-forming layer is transferred and fixed on the surface of the image-receiving sheet, one or more image-receiving layer is preferably provided on the support. The image-receiving layer is preferably formed of mainly an organic polymer binder. This binder is preferably a thermoplastic resin and examples thereof include homopolymers and copolymers of acryl-based monomers such as acrylic acid, methacrylic acid, acrylic acid ester and methacrylic acid ester; cellulose-based polymers such as methyl cellulose, ethyl cellulose and cellulose acetate; polymers and copolymers of vinyl-based monomers, such as polystyrene, polyvinylpyrrolidone, polyvinyl butyral, polyvinyl alcohol and polyvinyl chloride; condensed polymers such as polyester and polyamide; and rubber-based polymers such as butadiene-styrene copolymer. For obtaining an appropriate adhesive strength with the image-forming layer, the binder of the image-receiving layer is preferably a polymer having a glass transition temperature (Tg) of less than 90° C. For this purpose, it is also possible to add a plasticizer to the image-receiving layer. Furthermore, the binder polymer preferably has a Tg of 30° C. or more so as to prevent blocking between sheets. From the standpoint of improving the adhesive property with the image-forming layer at the laser recording and elevating the sensitivity or image strength, the binder polymer for use in the image-receiving layer is preferably the same as or analogous to the binder polymer used in the image-forming layer.

The Smooster value (i.e., the Smoother smoothness described in JAPAN TAPPI No.1) on the surface of the image-receiving layer is preferably from 0.5 to 50 mmHg (=about 0.0665 to 6.65 kPa) at 23° C. and 55% RH and at the same time, the Ra value is preferably from 0.05 to 0.4 $\mu$m. With these values, a large number of microscopic voids formed on the contact surface to inhibit the contact between the image-receiving layer and the image-forming layer can be reduced and this is advantageous in view of transfer and in turn image quality. The Ra value can be measured according to JIS B0601 using a surface roughness meter (Surfcom, manufactured by Tokyo Seimitsu Co., Ltd.). One second after the earth connection of the image-receiving sheet which is electrified according to U.S. Federal Test Standard 4046, the charge potential of the image-receiving layer is preferably from −100 to 100 V. The surface resistance of the image-receiving layer is preferably $10^9$ Ω or less at 23° C. and 55% RH. The coefficient of static friction is preferably 0.8 or less on the surface of the image-receiving layer and the surface energy on the surface of the image-receiving layer is preferably from 23 to 35 mg/m$^2$.

In the case of once forming an image on the image-receiving layer and re-transferring the image to printing paper or the like, at least one image-receiving layer is preferably formed of a photocurable material. Examples of the composition for the photocurable material include a combination of a) a photopolymerizable monomer comprising at least one polyfunctional vinyl or vinylidene compound capable of forming a photopolymer by the addition polymerization, b) an organic polymer, c) a photopolymerization initiator and if desired, additives such as thermopolymerization inhibitor. As the polyfunctional vinyl monomer, an unsaturated ester of polyol, particularly an ester of acrylic acid or methacrylic acid, such as ethylene glycol diacrylate and pentaerythritol tetraacrylate, is used.

Examples of the organic polymer include polymers described above as the polymer for the formation of the image-receiving layer. As for the photopolymerization inhibitor, a normal photoradical polymerization initiator such as benzophenone or Michler's ketone is used in a proportion of 0.1 to 20 mass % in the layer.

The thickness of the image-receiving layer is from 0.3 to 7 μm, preferably from 0.7 to 4 μm. If the thickness is less than 0.3 μm, the layer is readily ruptured at the re-transfer to printing paper due to insufficient layer strength, whereas if the thickness is too large, the gloss of image after the re-transfer to printing paper increases and approximation to a printed matter decreases.

(Other Layers)

A cushion layer may be provided between the support and the image-receiving layer. When a cushion layer is provided, the adhesive property between the image-forming layer and the image-receiving layer is elevated at the thermal transfer using a laser and the image quality can be enhanced. Furthermore, even if foreign matters are mingled between the thermal transfer sheet and the image-receiving sheet at the recording, the void between the image-receiving layer and the image-forming layer is reduced in the size due to deformation activity of the cushion layer, as a result, the size of image defect such as clear spot can also be made small. In addition, when an image is formed by the transfer and this image is transferred to a separately prepared printing paper or the like, the image-receiving surface is deformed according to the asperities on the paper surface and therefore, the transferability of the image-receiving layer can be improved. Furthermore, by reducing the gloss of the transferee material, the approximation to a printed matter can be improved.

The cushion layer has a structure easy to deform upon application of a stress onto the image-forming layer and for achieving the above-described effect, is preferably formed of a material having a low modulus of elasticity, a material having rubber elasticity or a thermoplastic resin which is easily softened under heating. The elastic modulus of the cushion layer is preferably from 0.5 MPa to 1.0 GPa, more preferably from 1 MPa to 0.5 GPa, still more preferably from 10 to 100 MPa, at room temperature. Also, for burying foreign matters such as dust, the penetration (25° C., 100 g, 5 seconds) prescribed by JIS K2530 is preferably 10 or more. The glass transition temperature of the cushion layer is 80° C. or less, preferably 25° C. or less, and the softening point is preferably from 50 to 200° C. For adjusting these physical properties, for example, Tg, a plasticizer may be suitably added into the binder.

Specific examples of the material used as the binder of the cushion layer include polyethylene, polypropylene, polyester, styrene-butadiene copolymers, ethylene-vinyl acetate copolymers, ethylene-acryl copolymers, vinyl chloride-vinyl acetate copolymers, vinylidene chloride resin, plasticizer-containing vinyl chloride resin, polyamide resin and phenol resin, in addition to rubbers such as urethane rubber, butadiene rubber, nitrile rubber, acryl rubber and natural rubber.

The thickness of the cushion layer varies depending on the resin used and other conditions but is usually from 3 to 100 μm, preferably from 10 to 52 μm.

The image-receiving layer and the cushion layer must be bonded until the laser recording stage but for transferring the image to printing paper, these layers are preferably provided in the peelable state. In order to facilitate the release, a peeling layer having a thickness of approximately from 0.1 to 2 μm is preferably provided between the cushion layer and the image-receiving layer. If the layer thickness is excessively large, the capability of the cushion layer cannot be easily brought out. Therefore, the layer thickness must be adjusted depending on the kind of the peeling layer.

Specific examples of the binder of the peeling layer include polyolefin, polyester, polyvinyl acetal, polyvinyl formal, polyparabanic acid, polymethyl methacrylate, polycarbonate, ethyl cellulose, nitrocellulose, methyl cellulose, carboxymethyl cellulose, hydroxypropyl cellulose, polyvinyl alcohol, polyvinyl chloride, urethane resin, fluorine-containing resin, styrenes such as polystyrene and acrylonitrile styrene, crosslinked products of these resins, thermosetting resins having a Tg of 65° C. or more, such as polyamide, polyimide, polyether imide, polysulfone, polyether sulfone and aramid, and cured products of these resins. The curing agent used here can be a general curing agent such as isocyanate and melamine.

On considering the above-described properties in the selection of the binder of the peeling layer, polycarbonate, acetal and ethyl cellulose are preferred in view of storability. Furthermore, an acrylic resin is preferably used in the image-forming layer, because good peelability can be provided at the time of re-transferring the image which is thermally transferred using a laser.

Also, another layer which is extremely reduced in the adhesive property with the image-forming layer on cooling may be used as the peeling layer. Specifically, a layer mainly comprising a heat-fusible compound such as wax or binder, or a thermoplastic resin may be provided.

Examples of the heat-fusible compound include the substances described in JP-A-63-193886. In particular, microcrystalline wax, paraffin wax and carnauba wax are preferred. As for the thermoplastic resin, preferred examples thereof include ethylene-based copolymers (e.g., ethylene-vinyl acetate resin) and cellulose-based resins.

In this peeling layer, additives such as higher fatty acid, higher alcohol, higher fatty acid ester, amide and higher amine may be added, if desired.

In another construction of the peeling layer, the layer is fused or softened on heating and undertakes cohesive failure by itself, thereby exhibiting peelability. This peeling layer preferably contains a supercooling substance.

Examples of the supercooling substance include poly-ε-caprolactone, polyoxyethylene, benzotriazole, tribenzylamine and vanillin.

In still another construction of the peeling layer, a compound capable of reducing the adhesive property with the image-receiving layer is incorporated. Examples of this compound include silicone-based resins such as silicone oil; fluorine-containing resins such as Teflon and fluorine-containing acrylic resin; polysiloxane resin; acetal-based resins such as polyvinyl butyral, polyvinyl acetal and polyvinyl formal; solid waxes such as polyethylene wax and amide wax; and fluorine-containing or phosphoric acid ester-based surfactants.

The peeling layer can be formed by a method where the above-described raw materials are dissolved or dispersed like a latex in a solvent and the solution or dispersion is coated on the cushion layer using coating means such as blade coater, roll coater, bar coater, curtain coater or gravure coater, or using extrusion lamination by hot melting. The peeling layer can also be formed by a method where the raw materials are dissolved or dispersed like a latex in a solvent, the solution or dispersion is coated on a temporary base using the above-described means, the coating is attached to the cushion layer, and the temporary base is peeled off.

The image-receiving sheet combined with the thermal transfer sheet may have a structure such that the image-receiving layer serves also as the cushion layer. In this case, the image-receiving sheet may have a structure of support/cushioning image-receiving layer or a structure of support/undercoat layer/cushioning image-receiving layer. Also in this case, the cushioning image-receiving layer is preferably provided in the peelable state so that the re-transfer to the printing paper can be facilitated. If the case is so, the image after the re-transfer to printing paper can be an image having excellent glossiness.

The thickness of the cushioning image-receiving layer is from 5 to 100 μm, preferably from 10 to 40 μm.

In the image-receiving sheet, a back layer is preferably provided on the surface of the support in the side opposite the surface where the image-receiving layer is provided, because the image-receiving sheet can be improved in the transportation property. For the purpose of attaining good transportation within the recording device, the back layer preferably contains an antistatic agent such as surfactant or tin oxide fine particle, and a matting agent such as silicon oxide or PMMA particle.

These additives can be added not only to the back layer but also, if desired, to the image-receiving layer or other layers. The kind of additive varies depending on the purpose and cannot be indiscriminately specified, however, for example, in the case of a matting agent, particles having an average particle size of 0.5 to 10 μm may be added to the layer in a proportion of approximately from 0.5 to 80%. The antistatic agent may be appropriately selected from various surfactants and electrically conducting agents and used such that the surface resistance of the layer is $10^{12}$ Ω or less, preferably $10^9$ Ω or less, under the conditions of 23° C. and 50% RH.

For the binder used in the back layer, a general-purpose polymer may be used, such as gelatin, polyvinyl alcohol, methyl cellulose, nitrocellulose, acetyl cellulose, aromatic polyamide resin, silicone resin, epoxy resin, alkyd resin, phenol resin, melamine resin, fluororesin, polyimide resin, urethane resin, acrylic resin, urethane-modified silicone resin, polyethylene resin, polypropylene resin, polyester resin, Teflon resin, polyvinyl butyral resin, vinyl chloride-based resin, polyvinyl acetate, polycarbonate, organic boron compounds, aromatic esters, fluorinated polyurethane and polyether sulfone.

When a crosslinkable water-soluble binder is used as the binder of the back layer, this is effective in preventing the matting agent from powder-falling or improving the scratch resistance of the back layer. This use is also greatly effective on the blocking during storage.

As for the crosslinking means, heat, active ray and pressure may be used individually or in combination without any particular limitation according to the properties of the crosslinking agent used. Depending on the case, an arbitrary adhesive layer may be provided on the support in the side where the back layer is provided, so that adhesive property to the support can be imparted.

For the matting agent which is preferably added to the back layer, an organic or inorganic fine particle can be used. Examples of the organic matting agent include a fine particle of radical polymerization-type polymer such as polymethyl methacrylate (PMMA), polystyrene, polyethylene and polypropylene, and a fine particle of condensed polymer such as polyester and polycarbonate.

The back layer is preferably provided in a coated amount of approximately from 0.5 to 5 g/m². If the coated amount is less than 0.5 g/m², the coatability is unstable and problems such as powder-falling of the matting agent are readily caused, whereas if it exceeds 5 g/m², the particle size of the suitable matting agent becomes very large and the image-receiving layer surface is embossed by the back layer during storage, as a result, missing or unevenness of a recorded image is liable to occur particularly in the thermal transfer of transferring a thin-film image-forming layer.

The matting agent preferably has a number average particle size 2.5 to 20 μm larger than the film thickness of the back layer comprising only a binder. In the matting agent, particles having a particle size of 8 μm or more must be present in an amount of 5 mg/m² or more, preferably from 6 to 600 mg/m². By containing such a matting agent, the foreign matter failure can be improved. Also, by using a matting agent having a narrow particle size distribution such that the value (δ/rn (=coefficient of variation in the particle size distribution)) obtained by dividing the standard deviation of the particle size distribution by the number average particle size is 0.3 or less, the defect generated due to particles having an extremely large particle size can be improved and moreover, a desired performance can be obtained with a smaller amount added. This coefficient of variation is preferably 0.15 or less.

In the back layer, an antistatic agent is preferably added so as to prevent the adhesion of foreign matters due to frictional electrification with a transportation roll. Examples of the antistatic agent which can be used include cationic surfactants, anionic surfactants, nonionic surfactants, polymer antistatic agents, electrically conducting fine particles and compounds over a wide range described in 11290 *no Kagaku Shohin* (11290 *Chemical Products*), Kagaku Kogyo Nippo Sha, pp. 875–876.

Among these substances as the antistatic agent which can be used in combination in the back layer, preferred are metal oxides such as carbon black, zinc oxide, titanium oxide and tin oxide, and electrically conducting fine particles such as organic semiconductor. In particular, the electrically conducting fine particle is preferred because the antistatic agent does not dissociate from the back layer and the antistatic effect can be stably obtained independently of the environment.

In the back layer, various activators or release agents such as silicone oil and fluororesin may also be added so as to impart coatability or releasability.

The back layer is particularly preferred when the cushion layer and the image-receiving layer each has a softening point of 70° C. or less as measured by TMA (thermomechanical analysis).

The TMA softening point is determined by elevating the temperature of an object to be measured at a constant temperature-rising rate while applying a constant load, and observing the phase of the object. In the present invention, the temperature where the phase of the object to be measured starts changing is defined as the TMA softening point. The measurement of the softening point by TMA can be performed using an apparatus such as Thermoflex manufactured by Rigaku Denki Sha.

In the image formation, the thermal transfer sheet and the image-receiving sheet can be used as a laminate obtained by superposing the image-forming layer of the thermal transfer sheet on the image-receiving layer of the image-receiving sheet.

The laminate of the thermal transfer sheet and the image-receiving sheet can be formed by various methods. For example, the laminate can be easily obtained by superposing the image-forming layer of the thermal transfer sheet and the image-receiving layer of the image-receiving sheet and passing these sheets between pressure and heating rollers. In this case, the heating temperature is preferably 160° C. or less, or 130° C. or less.

Another suitable method for obtaining the laminate is the above-described vacuum contact method. The vacuum contact method is a method where an image-receiving sheet is first wound around a drum having provided thereon a suction hole for vacuumization and then, a thermal transfer sheet having a slightly larger size than the image-receiving sheet is vacuum-contacted with the image-receiving sheet while uniformly expelling air by a squeeze roller. Other than these, a method where an image-receiving sheet is attached to a metal drum while mechanically pulling the image-receiving sheet and further thereon, a thermal transfer sheet is attached similarly while mechanically pulling the thermal transfer sheet, thereby contacting these sheets, may also be used. Among these methods, a vacuum contact method is preferred because the temperature of heat roller and the like needs not be controlled and the sheets can be rapidly and uniformly stacked with ease.

EXAMPLE

The present invention is described in greater detail below by referring to Examples, however, the present invention should not be construed as being limited thereto. In the Examples, unless otherwise indicated, the "parts" means "parts by mass (i.e., parts by weight)".

Example 1

Preparation of Thermal Transfer Sheet K (Black)

<Formation of Back Layer>

[Preparation of Coating Solution for Back First Layer]

| | |
|---|---|
| Water dispersion of acrylic resin ("JULYMER ET410", solid content: 20 mass %, Nippon Junyaku K.K.) | 2 parts |
| Antistatic agent (water dispersion of tin oxide-antimony oxide) (average particle size: 0.1 μm, 17 mass %) | 7.0 parts |
| Polyoxyethylene phenyl ether | 0.1 part |

-continued

| | |
|---|---|
| Melamine compound ("SUMITIC Resin M-3", produced by Sumitomo Chemical Co., Ltd.) | 0.3 parts |
| Distilled water to make a total of | 100 parts |

[Formation of Back First Layer]

One surface (back surface) of a 75 μm-thick biaxially stretched polyethylene terephthalate support (Ra is 0.01 μm on both surfaces) was subjected to a corona treatment and the coating solution for the back first layer was coated thereon to a dry thickness of 0.03 μm and dried at 180° C. for 30 seconds to form a back first layer. The Young's modulus in the machine direction of the support was 450 kg/mm² (=about 4.4 GPa) and the Young's modulus in the transverse direction was 500 kg/mm² (=about 4.9 GPa). The F-5 value in the machine direction of the support was 10 kg/mm² (=about 98 MPa) and the F-5 value in the transverse direction of the support was 13 kg/mm² (=about 127.4 MPa). The heat shrinkage rate of the support at 100° C. for 30 minutes was 0.3% in the machine direction and 0.1% in the transverse direction. The breaking strength was 20 kg/mm² (=about 196 MPa) in the machine direction and 25 kg/mm² (=about 245 MPa) in the transverse direction. The elastic modulus was 400 kg/mm² (=about 3.9 GPa).

[Preparation of Coating Solution for Back Second Layer]

| | |
|---|---|
| Polyolefin ("CHEMIPEARL S-120", 27 mass %, produced by Mitsui Petrochemical Industries, Ltd.) | 3.0 parts |
| Antistatic agent (water dispersion of tin oxide-antimony oxide) (average particle size: 0.1 μm, 17 mass %) | 2.0 parts |
| Colloidal silica ("SNOWTEX C", 20 mass %, produced by Nissan Chemicals Industries, Ltd.) | 2.0 parts |
| Epoxy compound ("DINACOL EX-614B", produced by Nagase Kasei K.K.) | 0.3 parts |
| Sodium polystyrenesulfonate | 0.1 part |
| Distilled water to make a total of | 100 parts |

[Formation of Back Second Layer]

The coating solution for the back second layer was coated on the back first layer to a dry thickness of 0.03 μm and then dried at 170° C. for 30 seconds to form a back second layer.

<Formation of Light-to-Heat Conversion Layer>

[Preparation of Coating Solution for Light-to-Heat Conversion Layer]

The components shown below were mixed while stirring with a stirrer to prepare a coating solution for the light-to-heat conversion layer.

[Composition of Coating Solution for Light-to-Heat Conversion Layer]

| | |
|---|---|
| Infrared light absorbing dye ("NK-2014", produced by Nippon Kanko Shikiso Co., Ltd., cyanine dye shown below) | 7.6 parts |

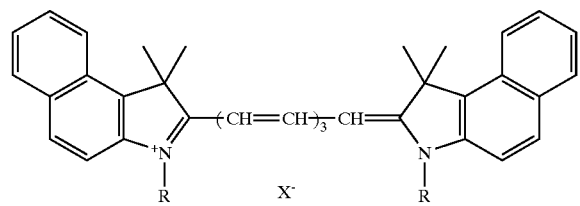

(wherein R represents $CH_3$ and $X^-$ represents $ClO_4^-$)

| | |
|---|---|
| Binder: polyimide resin shown below ("RIKACOTE SN-20", produced by Shin Nippon Rika K.K., thermal decomposition temperature: 510° C.) | 29.3 parts |

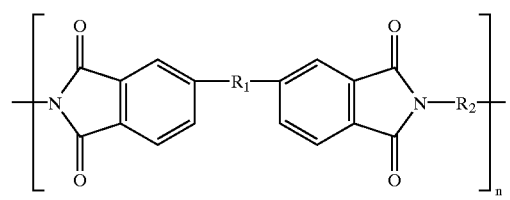

(wherein $R_1$ represents $SO_2$ and $R_2$ represents

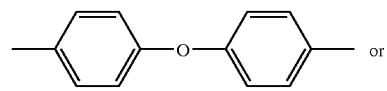 or

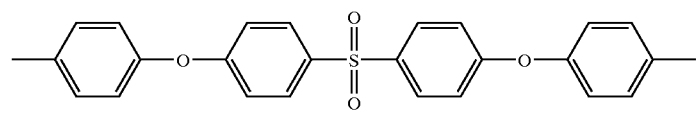

| | |
|---|---|
| Exxon Naphtha | 5.8 parts |
| N-Methyl-2-pyrrolidone (NMP) | 1,500 parts |
| Methyl ethyl ketone | 360 parts |
| Surfactant ("Megafac F-176", produced by Dainippon Ink & Chemicals Inc., F-containing surfactant) | 0.5 parts |
| Polyvinylpyrrolidone copolymer ("PVA/VA E-735", 7/3 copolymer of vinylpyrrolidone/vinyl acetate, 50 mass %, produced by ISP) | 3.0 parts |
| Matting agent ("SEAHOSTER KEP150", silica gel particle, produced by Nippon Shokubai K.K.) | 1.7 parts |

[Formation of Light-to-Heat Conversion Layer on Support Surface]

On the support opposite the back layer, the coating solution for the light-to-heat conversion layer prepared above was coated using a wire bar and then, the coating was dried for 2 minutes in an oven at 120° C. to form a light-to-heat conversion layer on the support. The optical density of the obtained light-to-heat conversion layer at a wavelength of 808 nm was measured using a UV-spectrophotometer UV-240 manufactured by Shimadzu Corporation and found to be OD=1.03. The cross-section of the light-to-heat conversion layer was observed through a scanning electron microscope and the layer thickness was found to be 0.3 μm on average.

<Formation of Image-Forming Layer>

[Preparation of Coating Solution for Black Image-Forming Layer]

The components shown below were charged into a mill of a kneader and a dispersion pretreatment was performed by adding a shear force while adding a slight amount of a solvent. To the obtained dispersion, the solvent was further added to finally have the following composition, and the resulting solution was dispersed in a sand mill for 2 hours to obtain a pigment dispersion mother solution.

[Composition of Black Pigment Dispersion Mother Solution]

| | |
|---|---|
| Polyvinyl butyral ("Eslec B BL-SH", produced by Sekisui Chemical Co., Ltd.) | 12.6 parts |
| Pigment (carbon black "MA-100", produced by Mitsubishi Chemical, PVC blackness: 10) | 10.5 parts |
| Pigment (carbon black "#5", produced by Mitsubishi Chemical, PVC blackness: 1) | 4.5 parts |
| Dispersion aid ("SOLSPERSE S-20000", produced by ICI) | 0.8 parts |
| n-Propyl alcohol | 79.4 parts |

Then, the components shown below were mixed while stirring with a stirrer to prepare a coating solution for the black image-forming layer.

[Composition of Coating Solution for Black Image-Forming Layer]

| | |
|---|---|
| Black pigment dispersion mother solution prepared above | 185.7 parts |
| Polyvinyl butyral ("Eslec B BL-SH", produced by Sekisui Chemical Co., Ltd.) | 11.9 parts |
| Wax-based compounds: | |
| (Stearic acid amide, "NEWTRON 2", produced by Nippon Seika) | 1.7 parts |
| (Behenic acid amide, "DIAMID BM", produced by Nippon Kasei) | 1.7 parts |
| (Lauric acid amide, "DIAMID Y", produced by Nippon Kasei) | 1.7 parts |
| (Palmitic acid amide, "DIAMID KP", produced by Nippon Kasei) | 1.7 parts |
| (Erucic acid amide, "DIAMID L-200", produced by Nippon Kasei) | 1.7 parts |
| (Oleic acid amide, "DIAMID O-200", produced by Nippon Kasei) | 1.7 parts |
| Rosin ("KE-311", produced by Arakawa Kagaku) | 11.4 parts |
| Surfactant ("Megafac F-176P", solid content: 20%, produced by Dainippon Ink & Chemicals Inc.) | 2.1 parts |
| Inorganic pigment ("MEK-ST" 30% methyl ethyl ketone solution, produced by Nissan Chemicals Industries, Ltd.) | 7.1 parts |
| n-Propyl alcohol | 1,050 parts |
| Methyl ethyl ketone | 295 parts |

The particles in the thus-obtained coating solution for the black image-forming layer were measured by a particle size distribution meter employing a laser scattering system, as a result, the average particle size was 0.25 μm and the particles of 1 μm or more occupied 0.5%.

4) Formation of Black Image-Forming Layer on Surface of Light-to-Heat Conversion Layer On the surface of the light-to-heat conversion layer formed above, the coating solution for the black image-forming layer prepared above was coated using a whirler over 1 minute and then, the coating was dried for 2 minutes in an oven at 100° C. to form a black image-forming layer on the light-to-heat conversion layer. In this way, Thermal Transfer Sheet K where a light-to-heat conversion layer and a black image-forming layer were provided in this order on a support was prepared.

The optical density (optical density: OD) of the black image-forming layer of Thermal Transfer Sheet K was measured by a Macbeth densitometer "TD-904" (W filter) and found to be OD=0.91. Also, the thickness of the black image-forming layer was measured and found to be 0.60 μm on average.

Manufacture of Thermal Transfer Sheet Y:

Thermal Transfer Sheet Y was manufactured in the same manner as in the manufacture of Thermal Transfer Sheet K except for using the coating solution for yellow image-forming layer having a composition shown below in place of the coating solution for black image-forming layer in the manufacture of Thermal Transfer Sheet K. The image-forming layer of Thermal Transfer Sheet Y obtained had a layer thickness of 0.42 μm.

[Composition of Yellow Pigment Dispersion Mother Solution]

Yellow Pigment Composition 1:

| | |
|---|---|
| Polyvinyl butyral ("Eslec B BL-SH", produced by Sekisui Chemical Co., Ltd.) | 7.1 parts |
| Pigment Yellow 180 (C.I. No. 21290) ("Novoperm Yellow P-HG", produced by Clariant Japan) | 12.9 parts |
| Dispersion aid ("SOLSPERSE S-20000", produced by ICI) | 0.6 parts |
| n-Propyl alcohol | 79.4 parts |

[Composition of Yellow Pigment Dispersion Mother Solution]

Yellow Pigment Composition 2:

| | |
|---|---|
| Polyvinyl butyral ("Eslec B BL-SH", produced by Sekisui Chemical Co., Ltd.) | 7.1 parts |
| Pigment Yellow 139 (C.I. No. 56298) ("Novoperm Yellow M2R 70", produced by Clariant Japan) | 12.9 parts |
| Dispersion aid ("SOLSPERSE S-20000", produced by ICI) | 0.6 parts |
| n-Propyl alcohol | 79.4 parts |

[Composition of Coating Solution for Yellow Image-Forming Layer]

| | |
|---|---|
| Yellow pigment dispersion mother solution prepared above [Yellow Pigment Composition 1: Yellow Pigment Composition 2 = 95:5 (by parts)] | 126 parts |
| Polyvinyl butyral ("Eslec B BL-SH", produced by Sekisui Chemical Co., Ltd.) | 4.6 parts |
| Wax-based compounds: | |
| (Stearic acid amide, "NEWTRON 2", produced by Nippon Seika) | 0.7 parts |
| (Behenic acid amide, "DIAMID BM", produced by Nippon Kasei) | 0.7 parts |
| (Lauric acid amide, "DIAMID Y", produced by Nippon Kasei) | 0.7 parts |
| (Palmitic acid amide, "DIAMID KP", produced by Nippon Kasei) | 0.7 parts |
| (Erucic acid amide, "DIAMID L-200", produced by Nippon Kasei) | 0.7 parts |
| (Oleic acid amide, "DIAMID O-200", produced by Nippon Kasei) | 0.7 parts |
| Nonionic surfactant ("CHEMISTAT 1100", produced by Sanyo Kasei) | 0.4 parts |
| Rosin ("KE-311", produced by Arakawa Kagaku) (component: resin acid 80–97%, | 2.4 parts |

-continued

| | |
|---|---|
| resin acid components: abietinic acid 30–40%, neoabitienic acid 10–20%, dihydroabitienic acid 14%, tetrahydroabitienic acid 14%) | |
| Surfactant ("Megafac F-176PF", solid content: 20%, produced by Dainippon Ink & Chemicals Inc.) | 0.8 parts |
| n-Propyl alcohol | 793 parts |
| Methyl ethyl ketone | 198 parts |

The obtained image-forming layer had the following physical properties.

The surface hardness of the image-forming layer, which is preferably 10 g or more with a sapphire needle, was 200 g or more.

The Smooster value on the surface, which is preferably from 0.5 to 50 mmHg (=about 0.0665 to 6.65 kPa) at 23° C. and 55% RH, was 2.3 mmHg (=about 0.31 kPa).

The coefficient of static friction on the surface, which is preferably 0.2 or less, was 0.1.

Recording was performed using laser light having a light intensity of 1,000 W/mm$^2$ or more on the exposure surface at a linear velocity of 1 m/sec or more.

Manufacture of Thermal Transfer Sheet M

Thermal Transfer Sheet M was manufactured in the same manner as in the manufacture of Thermal Transfer Sheet K except for using the coating solution for magenta image-forming layer having a composition shown below in place of the coating solution for black image-forming layer in the manufacture of Thermal Transfer Sheet K. The image-forming layer of Thermal Transfer Sheet M obtained had a layer thickness of 0.38 μm.

[Composition of Magenta Pigment Dispersion Mother Solution]

Magenta Pigment Composition 1:

| | |
|---|---|
| Polyvinyl butyral ("DENKA BUTYRAL #2000-L", produced by Electrochemical Industry Co., Ltd., Vicat softening point: 57° C.) | 12.6 parts |
| Pigment Red 57:1 (C.I. No. 15850:1) ("Symuler Brilliant Carmine 6B-229", produced by Dainippon Ink & Chemicals Inc.) | 15.0 parts |
| Dispersion aid ("SOLSPERSE S-20000", produced by ICI) | 0.6 parts |
| n-Propyl alcohol | 80.4 parts |

[Composition of Magenta Pigment Dispersion Mother Solution]

Magenta Pigment Composition 2:

| | |
|---|---|
| Polyvinyl butyral ("DENKA BUTYRAL #2000-L", produced by Electrochemical Industry Co., Ltd., Vicat softening point: 57° C.) | 12.6 parts |
| Pigment Red 57:1 (C.I. No. 15850:1) ("Lionol Red 6B-4290G", produced by Toyo Ink Mfg. Co., Ltd.) | 15.0 parts |
| Dispersion aid ("SOLSPERSE S-20000", produced by ICI) | 0.6 parts |
| n-Propyl alcohol | 79.4 parts |

[Composition of Coating Solution for Magenta Image-Forming Layer]

| | |
|---|---|
| Magenta pigment dispersion mother solution prepared above [Magenta Pigment Composition 1 : Magenta Pigment Composition 2 = 95:5 (by parts)] | 163 parts |
| Polyvinyl butyral ("DENKA BUTYRAL #2000-L", produced by Electrochemical Industry Co., Ltd., Vicat softening point: 57° C.) | 4.0 parts |
| Wax-based compounds: | |
| (Stearic acid amide, "NEWTRON 2", produced by Nippon Seika) | 1.0 part |
| (Behenic acid amide, "DIAMID BM", produced by Nippon Kasei) | 1.0 part |
| (Lauric acid amide, "DIAMID Y", produced by Nippon Kasei) | 1.0 part |
| (Palmitic acid amide, "DIAMID KP", produced by Nippon Kasei) | 1.0 part |
| (Erucic acid amide, "DIAMID L-200", produced by Nippon Kasei) | 1.0 part |
| (Oleic acid amide, "DIAMID O-200", produced by Nippon Kasei) | 1.0 part |
| Nonionic surfactant ("CHEMISTAT 1100", produced by Sanyo Kasei) | 0.7 parts |
| Rosin ("KE-311", produced by Arakawa Kagaku) (component: resin acid 80–97%, resin acid components: abietinic acid 30–40%, neoabitienic acid 10–20%, dihydroabitienic acid 14%, tetrahydroabitienic acid 14%) | 4.6 parts |
| Pentaerythritol tetraacrylate ("NK Ester A-TMMT", produced by Shin Nakamura Kagaku K.K.) | 2.5 parts |
| Surfactant ("Megafac F-176PF", solid content: 20%, produced by Dainippon Ink & Chemicals Inc.) | 1.3 parts |
| n-Propyl alcohol | 848 parts |
| Methyl ethyl ketone | 246 parts |

The obtained image-forming layer had the following physical properties.

The surface hardness of the image-forming layer, which is preferably 10 g or more with a sapphire needle, was 200 g or more.

The Smooster value on the surface, which is preferably from 0.5 to 50 mmHg (=about 0.0665 to 6.65 kPa) at 23° C. and 55% RH, was 3.5 mmHg (=about 0.47 kPa).

The coefficient of static friction on the surface, which is preferably 0.2 or less, was 0.08.

Recording was performed using laser light having a light intensity of 1,000 W/mm$^2$ or more on the exposure surface at a linear velocity of 1 m/sec or more.

Manufacture of Thermal Transfer Sheet C

Thermal Transfer Sheet C was manufactured in the same manner as in the manufacture of Thermal Transfer Sheet K except for using the coating solution for cyan image-forming layer having a composition shown below in place of the coating solution for black image-forming layer in the manufacture of Thermal Transfer Sheet K. The image-forming layer of Thermal Transfer Sheet C obtained had a layer thickness of 0.45 μm.

[Composition of Cyan Pigment Dispersion Mother Solution]
Cyan Pigment Composition 1:

| | |
|---|---|
| Polyvinyl butyral ("Eslec B BL-SH", produced by Sekisui Chemical Co., Ltd.)) | 12.6 parts |
| Pigment Blue 15:4 (C.I. No. 74160) ("Cyanine Blue 700-10FG", produced by Toyo Ink Mfg. Co., Ltd.) | 15.0 parts |
| Dispersion aid ("PW-36", produced by Kusumoto Kasei K.K.) | 0.8 parts |
| n-Propyl alcohol | 110 parts |

[Composition of Cyan Pigment Dispersion Mother Solution]
Cyan Pigment Composition 2:

| | |
|---|---|
| Polyvinyl butyral ("Eslec B BL-SH", produced by Sekisui Chemical Co., Ltd.)) | 12.6 parts |
| Pigment Blue 15 (C.I. No. 74160) ("Lionol Blue 7027", produced by Toyo Ink Mfg. Co., Ltd.) | 15.0 parts |
| Dispersion aid ("PW-36", produced by Kusumoto Kasei K.K.) | 0.8 parts |
| n-Propyl alcohol | 110 parts |

[Composition of Coating Solution for Cyan Image-Forming Layer]

| | |
|---|---|
| Cyan pigment dispersion mother solution prepared above [Cyan Pigment Composition 1 : Cyan Pigment Composition 2 = 90:10 (by parts)] | 118 parts |
| Polyvinyl butyral ("Eslec B BL-SH", produced by Sekisui Chemical Co., Ltd.)) | 5.2 parts |
| Inorganic pigment "MEK-ST" | 1.3 parts |
| Wax-based compounds: | |
| (Stearic acid amide, "NEWTRON 2", produced by Nippon Seika) | 1.0 part |
| (Behenic acid amide, "DIAMID BM", produced by Nippon Kasei) | 1.0 part |
| (Lauric acid amide, "DIAMID Y", produced by Nippon Kasei) | 1.0 part |
| (Palmitic acid amide, "DIAMID KP", produced by Nippon Kasei) | 1.0 part |
| (Erucic acid amide, "DIAMID L-200", produced by Nippon Kasei) | 1.0 part |
| (Oleic acid amide, "DIAMID O-200", produced by Nippon Kasei) | 1.0 part |
| Rosin ("KE-311", produced by Arakawa Kagaku) (component: resin acid 80–97%, resin acid components: abietinic acid 30–40%, neoabitienic acid 10–20%, dihydroabitienic acid 14%, tetrahydroabitienic acid 14%) | 2.8 parts |
| Pentaerythritol tetraacrylate ("NK Ester A-TMMT", produced by Shin Nakamura Kagaku K.K.) | 1.7 parts |
| Surfactant ("Megafac F-176PF", solid content: 20%, produced by Dainippon Ink & Chemicals Inc.) | 1.7 parts |
| n-Propyl alcohol | 890 parts |
| Methyl ethyl ketone | 247 parts |

The obtained image-forming layer had the following physical properties.

The surface hardness of the image-forming layer, which is preferably 10 g or more with a sapphire needle, was 200 g or more.

The Smooster value on the surface, which is preferably from 0.5 to 50 mmHg (=about 0.0665 to 6.65 kPa) at 23° C. and 55% RH, was 7.0 mmHg (=about 0.93 kPa).

The coefficient of static friction on the surface, which is preferably 0.2 or less, was 0.08.

Recording was performed using laser light having a light intensity of 1,000 W/mm$^2$ or more on the exposure surface at a linear velocity of 1 m/sec or more.

Manufacture of Image-Receiving Sheet

A coating solution for the cushion layer and a coating solution for the image-receiving layer each having the following composition were prepared.

| 1) Coating Solution for Cushion Layer | |
|---|---|
| Vinyl chloride-vinyl acetate copolymer (main binder) ("MPR-TSL", produced by Nisshin Kagaku) | 20 parts |
| Plasticizer ("PARAPLEX G-40", produced by CP. HALL. COMPANY) | 10 parts |
| Surfactant (Fluorine based coating aid: "Megafac F-177", produced by Dainippon Ink & Chemicals Inc.) | 0.5 parts |
| Antistatic agent (quaternary ammonium salt) ("SAT-5 Supper (IC)", produced by Nippon Junyaku K.K.) | 0.3 parts |
| Methyl ethyl ketone | 60 parts |
| Toluene | 10 parts |
| N,N-Dimethylformamide | 3 parts |
| 2) Coating Solution for Image-Receiving Layer | |
| Polyvinyl butyral ("Eslec B BL-SH", produced by Sekisui Chemical Co., Ltd.) | 8 parts |
| Antistatic agent ("SANSTAT 2012A", produced by Sanyo Kasei) | 0.7 parts |
| Surfactant ("Megafac F-177", produced by Dainippon Ink & Chemicals Inc.) | 0.1 part |
| n-Propyl alcohol | 20 parts |
| Methanol | 20 parts |
| 1-Methoxy-2-propanol | 50 parts |

The coating solution for the formation of a cushion layer prepared above was coated on a white PET support ("LUMILER #130E58", produced by Toray Industries, Inc., thickness: 130 μm) using a small-width coating machine and then, the coated layer was dried. Thereafter, the coating solution for the image-receiving layer was coated and dried. The coated amounts of coating solutions were controlled such that after the drying, the cushion layer had a thickness of about 20 μm and the image-receiving layer had a thickness of about 2 μm. The white PET support was a void-containing plastic support comprising a laminate (total thickness: 130 μm, specific gravity: 0.8) of a void-containing polyethylene terephthalate layer (thickness: 116 μm, porosity: 20%) and titanium oxide-containing polyethylene terephthalate layers (thickness: 7 μm, titanium oxide content: 2%) provided on both surfaces of the void-containing polyethylene terephthalate layer. The manufactured material was taken up into a roll form and stored at room temperature for 1 week. Thereafter, this material was used for image recording by laser light described later.

The obtained image-receiving layer had the following physical properties.

The surface roughness Ra, which is preferably from 0.4 to 0.01 μm, was 0.02 μm.

The waviness on the surface of the image-receiving layer, which is preferably 2 μm or less, was 1.2 μm.

The Smooster value on the surface of the image-receiving layer, which is preferably from 0.5 to 50 mmHg (=about 0.0665 to 6.65 kPa) at 23° C. and 55% RH, was 0.8 mmHg (=about 0.11 kPa).

The coefficient of static friction on the surface of the image-receiving layer, which is preferably 0.8 or less, was 0.37.

Formation of Transfer Image

The image-receiving sheet (56 cm×79 cm) prepared above was wound around a 38 cm-diameter rotary drum having punched thereon vacuum section holes (plane density: 1 hole per area of 3 cm×8 cm) having a diameter of 1 mm, and vacuum-adsorbed. Subsequently, Thermal Transfer Sheet K (black) prepared above, which was cut into 61 cm×84 cm, was superposed to uniformly protrude from the image-receiving sheet, and contact-laminated while squeezing by a squeeze roller to allow air to be suctioned through the section holes. The decompression degree was −150 mmHg (=about 81.13 kPa) to 1 atm. in the state where the section holes were closed. The drum was rotated and on the laminate surface on the drum, semiconductor laser light at a wavelength of 808 nm were irradiated from the outside and converged to form a spot of 7 μm on the surface of the light-to-heat conversion layer. While moving the light in the direction (sub-scanning) right-angled to the rotating direction (main scanning direction) of the rotary drum, a laser image (image and line) was recorded on the laminate. The laser irradiation conditions were as follows. The laser beam used in this Example was a laser beam having a multi-beam two-dimensional arrangement comprising parallelograms forming 5 lines in the main scanning direction and 3 lines in the sub-scanning direction.

| Laser power: | 110 mW |
| Rotation number of drum | 500 rpm |
| Sub-scanning pitch | 6.35 μm |

Humidity and temperature in environment: 23° C., 50%

After the completion of laser recording, the laminate was removed from the drum and Thermal Transfer Sheet K was manually peeled off from the image-receiving sheet, as a result, it was confirmed that only the image-forming layer of Thermal Transfer Sheet K in the region irradiated with light was transferred to the image-receiving sheet from Thermal Transfer Sheet K.

In the same manner as above, an image was transferred to the image-receiving sheet from each thermal transfer sheet of Thermal Transfer Sheet Y, Thermal Transfer Sheet M and Thermal Transfer Sheet C. The four-color image thus transferred was further transferred to recording paper to form a multicolor image. As a result, a multicolor image having good image quality and stable transfer density could be formed even when laser recording with high energy was performed using laser light having a multi-beam two-dimensional arrangement.

Example 2

A transfer image was formed in the same manner as in Example 1 except that in the preparation of thermal transfer sheet of Example 1, the polyvinylpyrrolidone copolymer used in the coating solution for light-to-heat conversion layer was changed to 1.0 part of PVP/VA S-630 (6/4 copolymer of vinylpyrrolidone/vinyl acetate) produced by ISP and the matting agent was changed to 1.0 part of TOSPEARL S-120 (silicon-based organic matting agent) produced by Toshiba Silicone.

Example 3

A transfer image was formed in the same manner as in Example 2 except that in the preparation of thermal transfer sheet of Example 2, the polyvinylpyrrolidone copolymer used in the coating solution for light-to-heat conversion layer was changed to 3.7 part of ANTARA 430 (7/3 copolymer latex of vinylpyrrolidone/styrene, 40 mass %) produced by ISP.

Example 4

A transfer image was formed in the same manner as in Example 2 except that in the preparation of thermal transfer sheet of Example 2, the polyvinylpyrrolidone copolymer used in the coating solution for light-to-heat conversion layer was changed to AGRIMER AL-10LC (9/1 copolymer of vinylpyrrolidone/1-butene) produced by ISP.

Example 5

A transfer image was formed in the same manner as in Example 2 except that in the preparation of thermal transfer sheet of Example 2, the polyvinylpyrrolidone copolymer used in the coating solution for light-to-heat conversion layer was changed to Polymer ACP-1005 (vinylpyrrolidone/acrylic acid copolymer) produced by ISP.

Comparative Example 1

A transfer image was formed in the same manner as in Example 1 except that in the preparation of thermal transfer sheet of Example 1, the polyvinylpyrrolidone copolymer used in the coating solution for light-to-heat conversion layer was not added.

Comparative Example 2

A transfer image was formed in the same manner as in Example 1 except that in the preparation of thermal transfer sheet of Example 1, the polyvinylpyrrolidone copolymer used in the coating solution for light-to-heat conversion layer was changed to 0.3 parts of JONCRYL 611 (styrene/acrylic acid copolymer) produced by Johnson Polymer.

The images in these Examples and Comparative Examples were evaluated as follows.

The evaluation was made on a four-color image. As for the color hue, a value of cyan image when the change of b* is largest is shown. The color hue was measured by a densitometer (X-rite 938, manufactured by X-rite). b* is an element of L*a*b* color specification system.

TABLE 1

| | Construction | | Evaluation | | | |
|---|---|---|---|---|---|---|
| | | | | Line | b* of C | Unevenness in Density of 50% |
| | Additive | Matting Agent | Solid Part | Image Part | Solid Image | Halftone Dot Image |
| Example 1 | PVP/VA E-735 | SEAHOSTER KEP 150 | ○ | ○ | ○ −48.1 | ○: even and uniform |
| Example 2 | PVP/VA S-630 | TOSPEARL 120 | ○ | ○ | ○ −47.9 | ○: even and uniform |
| Example 3 | ANTARA 430 | TOSPEARL 120 | ○ | ○ | ○ −48.0 | ○: even and uniform |
| Example 4 | AGRIMER AL-10LC | TOSPEARL 120 | ○ | ○ | ○ −47.5 | ○: even and uniform |
| Example 5 | Copolymer ACP-1005 | TOSPEARL 120 | ○ | ○ | ○ −47.7 | ○: even and uniform |
| Comparative Example 1 | none | SEAHOSTER KEP 150 | ○ | M, K: X Y, C: Δ | X −44.1 | ○: even and uniform |
| Comparative Example 2 | JONCRYL 611 | SEAHOSTER KEP 150 | ○ | ○ | ○ −48.1 | X: uneven |

(Evaluation of Image Quality)

The solid part and the line image part of the transfer image obtained using Thermal Transfer Sheets K, C, M and Y were observed through an optical microscope, as a result, the solid part was free of gap and the line image had good resolution. The image quality was evaluated with an eye according to the following criteria.

Solid Part:
  ○: At recording, no gap and no transfer failure.
  Δ: At recording, gap and transfer failure are partially generated.
  X: At recording, gap and transfer failure are generated throughout the entire surface.

Line Image Part:
  ○: The edge of line image is sharp, revealing good resolution.
  Δ: The edge of line image is indented and bridging is partially generated.
  X: Bridging is generated throughout the entire surface.

According to the present invention, a homopolymer and/or a copolymer of vinylpyrrolidone is incorporated into the light-to-heat conversion layer, so that the transfer image can be improved in the unevenness of density, can be prevented from worsening of color hue due to transfer of a decomposition product or the like of the light-to-heat conversion substance to the thermal transfer sheet, and can have good color hue.

The entitle disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. An image-forming system comprising:
   an image receiving sheet having at least an image-receiving layer; and
   at least four thermal transfer sheets each comprising a support having thereon at least a light-to-heat conversion layer and an image-forming layer, wherein the light-to-heat conversion layer of said thermal transfer sheet comprises a homopolymer and/or a copolymer of vinylpyrrolidone and the at least four thermal transfer sheets include a thermal transfer sheet comprising an image-forming layer containing a yellow pigment, a thermal transfer sheet comprising an image-forming layer containing a magenta pigment, a thermal transfer sheet comprising an image-forming layer containing a cyan pigment, and a thermal transfer sheet comprising an image-forming layer containing a black pigment;
   wherein said light-to-heat conversion layer comprises a main binder in addition to said homopolymer and/or copolymer of vinylpyrrolidone, wherein said main binder is a polyimide resin or a polyamide resin; and
   wherein said homopolymer and/or copolymer of vinylpyrrolidone comprises a vinylpyrrolidone copolymer, wherein the copolymer component of said vinylpyrrolidone copolymer is incompatible with the main binder of the light-to-heat conversion layer.

2. The image-forming system as claimed in claim 1, wherein said homopolymer and/or a copolymer of vinylpyrrolidone comprises a vinylpyrrolidone copolymer which contains a vinylpyrrolidone moiety in a molar ratio of 50% to less than 100%.

3. The image-forming system as claimed in claim 1, wherein said homopolymer and/or a copolymer of vinylpyrrolidone comprises a vinylpyrrolidone copolymer and the copolymer component of said vinylpyrrolidone copolymer is selected from the group consisting of vinyl acetate, styrene, olefin, acrylic acid, methacrylic acid, and derivatives thereof.

4. The image-forming system as claimed in claim 1, wherein said image forming layer of one of said at least four thermal transfer sheets is in contact with the image-receiving layer of said image receiving sheet.

5. An image formation method using said image forming system of claim 1 comprising:

(1) superposing the image-forming layer of one of said at least four thermal transfer sheets and said image-receiving layer to face each other and (2) irradiating a laser light from the support side of said one of said at least four thermal transfer sheets to transfer the laser light-irradiated region of the image-forming layer onto the image-receiving layer of the image-receiving sheet, thereby recording an image, and repeating (1) and (2) for each of said at least four thermal transfer sheets.

6. A method for manufacturing a color proof, comprising re-transferring a full color image formed on the image-receiving layer of an image-receiving sheet by the image formation method described in claim 5, together with the image-receiving layer onto a printing paper.

7. The image-forming system as claimed in claim 1, wherein the blending ratio of the main binder and the vinylpyrrolidone polymer and/or vinylpyrrolidone copolymer is from 0.1 to 30% by weight based on the main binder.

8. The image-forming system as claimed in claim 1, wherein the blending ratio of the main binder and the vinylpyrrolidone polymer and/or vinylpyrrolidone copolymer is from 0.1 to 30% by weight based on the main binder.

9. The image-forming system as claimed in claim 1, wherein the hydrogen atom in the ring part of the vinylpyrrolidone polymer and/or the vinylpyrrolidone copolymer is substituted by an alkyl group or a halogen atom.

* * * * *